(12) United States Patent
Takagi et al.

(10) Patent No.: US 6,226,310 B1
(45) Date of Patent: *May 1, 2001

(54) SEMICONDUCTOR OPTICAL DEVICE

(75) Inventors: Kazuhisa Takagi; Hitoshi Tada, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,784

(22) Filed: Mar. 2, 1998

(30) Foreign Application Priority Data

Sep. 29, 1997 (JP) .................................... 9-263361

(51) Int. Cl.[7] ...................................................... H01S 3/19
(52) U.S. Cl. ............................... 372/50; 372/45; 372/46; 372/102; 385/14; 385/131
(58) Field of Search ................................. 372/43, 44, 45, 372/46, 50, 48, 102, 103; 385/14, 131

(56) References Cited

U.S. PATENT DOCUMENTS

| 4,802,182 | 1/1989 | Thornton et al. . |
| 5,499,261 | 3/1996 | Welch et al. . |
| 5,787,106 | * 7/2000 | Tabuchi et al. ........................ 372/50 |
| 5,987,046 | * 11/1999 | Kobayashi et al. ..................... 372/45 |
| 6,055,256 | * 4/2000 | Nakatsuka et al. ..................... 372/46 |

FOREIGN PATENT DOCUMENTS 766502  3/1995  (JP) .

* cited by examiner

Primary Examiner—Hemang Sanghavi
(74) Attorney, Agent, or Firm—Leydig, Voit & Mayer, Ltd.

(57) ABSTRACT

A semiconductor optical device includes a semiconductor laser region for producing laser light and having a first optical waveguide mesa structure including a first active layer and a diffraction grating, and first current blocking layers adjacent to opposite sides; a light modulator region for modulating the laser light and having a second optical waveguide mesa structure continuous with the first optical waveguide mesa structure and including a second active layer, and second current blocking layers adjacent to opposite sides; and a window region for propagating the laser light modulated by the light modulator region and having a mesa-shaped window structure continuous with the second optical waveguide mesa structure, the mesa width of the window structure being larger than the mesa width of the second optical waveguide mesa structure. The light is prevented from leaking from the window and reaching the interface of the window structure and a burying layer adjacent to the window structure. The laser light is not reflected at the interface of the window structure and the buried layer. The shape of the beam of laser light emitted from the window structure is not distorted, resulting in a satisfactory connection to an optical system.

4 Claims, 20 Drawing Sheets

SEMICONDUCTOR OPTICAL DEVICE

FIELD OF THE INVENTION

The present invention relates to a semiconductor optical device in which a light modulator and a semiconductor laser are integrated, and a fabricating method thereof. More particularly, the invention relates to a semiconductor optical device employed in trunk line optical communication system and a fabricating method thereof.

BACKGROUND OF THE INVENTION

Conventionally, a semiconductor optical device comprising an electro-absorption type light modulator and a semiconductor laser that are integrated on a substrate has been used as a light source for digital optical communication of 2.5 Gb/s to 40 Gb/s. FIG. 28 is a schematic perspective view illustrating a principal part of a conventional semiconductor optical device. FIG. 29 is an enlarged schematic perspective view illustrating a structure of a light modulator region of the semiconductor optical device.

Referring to FIG. 28, a semiconductor optical device 1 has a laser region 2, a light modulator region 3, and an isolation region 4 between the laser region 2 and the light modulator region 3. An electrode 15 is placed at the light modulator region 3, and an electrode 16 is placed at the laser region 2.

The laser region 2 has a diffraction grating and constitutes a so-called distributed feedback laser. In this distributed feedback laser, light wavelength easily varies due to light reflected at a light emitting facet, i.e., return light. For this reason, a window region 5 having no optical waveguide is usually provided continuously with the light modulator region 3.

More specifically, as shown in FIG. 29, in the light modulator region 3, a buffer layer 7 serving as a lower cladding layer, a first light confinement layer 8, an active layer 9, a second light confinement layer 10, a first upper cladding layer 11, and a second upper cladding layer 12 are successively disposed on a substrate 6. In the window region 5, a buried layer 17, a hole trap layer 18, and the second upper cladding layer 12 are successively disposed on the substrate 6. A contact layer 13 and an insulating film 14 are disposed on the second upper cladding layer 12. In other words, the window region 5 has no active layer 9 and no optical waveguide.

By providing the window region 5, a spot diameter of light having passed through the light modulator region 3 spreads. That is, the light advances radially. Therefore, the rate of light that is reflected at a light emitting facet 19, i.e., a facet of the window region 5, and returns to the optical waveguides in the light modulator region 3 and the laser region 2 is reduced. As a result, variations in light wavelength are suppressed.

By the way, the light having passed through the light modulator region 3 goes into the window region 5. At this time, the following problem arises from the radial spread of the light.

There is a case in which the light radially spreading leaks out of the window region 5, that is, the light radially spreading goes from the window region 5 into a region 20 comprising, for example, a buried polyimide layer, which is adjacent to the side portion of the window region 5. In such a case, since the window region 5 and the region 20 usually comprise different materials, the light is reflected at the interface of the window region 5 and the region 20, which causes irregular reflection of the light in the window region 5, leading to deterioration of a beam shape of light that is emitted from the emitting facet 19. This means that the loss of the light at the window region 5 increases. Incidentally, in a conventional example, the loss of the light became about 50%. In the case where the loss of the light is considerable as described above, connection to an optical system cannot be sufficiently performed when the semiconductor optical device 1 is used in optical communication.

SUMMARY OF THE INVENTION

It is an object of the present invention to provide a semiconductor optical device in which irregular reflection of light in a window region is prevented, thereby suppressing deterioration of the beam shape of emitted light.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor optical device includes a semiconductor laser region for producing laser light and having a first optical waveguide mesa structure, the first optical waveguide mesa structure including a first optical waveguide portion including a first active layer and a diffraction grating, and first current blocking layers adjacent to both sides of the first optical waveguide portion; a light modulator region for modulating the laser light produced by the semiconductor laser region and having a second optical waveguide mesa structure, the second optical waveguide mesa structure being continuous with the first optical waveguide mesa structure and including a second optical waveguide portion comprising a second active layer, and second current blocking layers adjacent to both sides of the second optical waveguide portion; a window region for radially propagating the laser light modulated by the light modulator region and having a mesa-shaped window structure, the window structure being continuous with the second optical waveguide mesa structure; and a semiconductor substrate on which the semiconductor laser region, the light modulator region, and the window region are integrated; wherein the mesa width of the window structure is larger than the mesa width of the second optical waveguide mesa structure. Therefore, even when laser light is radially propagated from the light modulator region, the light is prevented from leaking out of the window structure. In other words, the laser light radially propagated is prevented from reaching the interface of the window structure and a buried layer adjacent to the window structure. Consequently, the laser light can be prevented from being reflected at the interface of the window structure and the buried layer, thereby preventing irregular reflection of the laser light in the window structure. As a result, deterioration of the beam shape of laser light emitted from the window structure can be suppressed, resulting in a semiconductor optical device in which satisfactory connection to an optical system is possible.

According to a second aspect of the present invention, in the semiconductor optical device of the first aspect of the invention, the window structure is continuous with the second optical waveguide mesa structure; and the mesa width of the window structure gradually increases corresponding to the radiant angle of the laser light radially propagated. Accordingly, the laser light radially propagated in the window structure is prevented all the more from reaching the interface of the window structure and the buried layer. Thus, the laser light can be reliably prevented from being reflected at the interface of the window structure and the buried layer, resulting in no irregular reflection of the laser light in the window structure. Consequently, deterioration of the beam shape of laser light emitted from the window structure can be reliably suppressed, resulting in a semiconductor optical device in which satisfactory connection to an optical system is possible.

Further, since the laser light radially propagated is prevented from leaking out of the window structure by gradually increasing the mesa width of the window structure corresponding to the radiant angle of the laser light, the size of the window structure is reduced to a minimum. As a result, an increase in electric capacity with an increase in size of the window structure can be suppressed, which does not exert a noticeable bad influence on high-speed operation of the light modulator region.

According to a third aspect of the present invention, a method of fabricating a semiconductor optical device including a semiconductor laser region for producing laser light and having a first optical waveguide mesa structure, the first optical waveguide mesa structure including a first optical waveguide portion including a first active layer and a diffraction grating, and first current blocking layers adjacent to both sides of the first optical waveguide portion; a light modulator region for modulating the laser light produced by the semiconductor laser region and having a second optical waveguide mesa structure, the second optical waveguide mesa structure being continuous with the first optical waveguide mesa structure and including a second optical waveguide portion comprising a second active layer, and second current blocking layers adjacent to both sides of the second optical waveguide portion; a window region for radially propagating the laser light modulated by the light modulator region and having a mesa-shaped window structure, the window structure being continuous with the second optical waveguide mesa structure; and a semiconductor substrate on which the semiconductor laser region, the light modulator region, and the window region are integrated, includes a first multilayer structure fabricating process for fabricating a first multilayer structure including a first active layer and a diffraction grating on a semiconductor substrate; a first etching process for etching and removing regions of the first multilayer structure where a light modulator region and a window region are to be formed; a second multilayer structure fabricating process for filling spaces that have been produced by the first etching process with a second multilayer structure including a second active layer; a second etching process for etching and removing a region of the second multilayer structure where a window region is to be formed, regions of the second multilayer structure except a region where a second optical waveguide portion is to be formed, and regions of the first multilayer structure except a region where a first optical waveguide portion is to be formed, thereby forming a first optical waveguide portion and a second optical waveguide portion; a first buried layer forming process for filling spaces that have been produced by the second etching process with semiconductor layers constituting first and second current blocking layers, thereby forming a first buried layer in the region where a window region is to be formed and forming respective current blocking layers; a third etching process for forming a resist pattern on the first multilayer structure, the second multilayer structure, the first buried layer, and the respective current blocking layers, and using the resist pattern as a mask performing selective etching, thereby forming a first optical waveguide mesa structure and a second optical waveguide mesa structure and forming a window structure having a mesa width larger than that of the second optical waveguide mesa structure; and a second buried layer forming process for filling spaces that have been produced by the third etching process with a second buried layer having a dielectric constant smaller than that of the first buried layer. In the third etching process, the window structure is formed so that the mesa width of the window structure is larger than the mesa width of the second optical waveguide mesa structure. Therefore, even when laser light is radially propagated from the light modulator region, the light is prevented from leaking out of the window structure. In other words, the laser light radially propagated is prevented from reaching the interface of the window structure and the second buried layer. Consequently, the laser light can be prevented from being reflected at the interface of the window structure and the second buried layer, thereby preventing irregular reflection of the laser light in the window structure. As a result, deterioration of the beam shape of laser light emitted from the window structure can be suppressed, whereby a semiconductor optical device in which satisfactory connection to an optical system is possible is fabricated.

According to a fourth aspect of the present invention, in the fabricating method of the third aspect of the invention, the resist pattern formed by the third etching process has a funnel shape, and a portion of the resist pattern corresponding to the window structure is formed so that the mesa width of the window structure gradually increases corresponding to the radiant angle of laser light radially propagated. Accordingly, the laser light radially propagated in the window structure is prevented all the more from reaching the interface of the window structure and the second buried layer. Thus, the laser light can be reliably prevented from being reflected at the interface of the window structure and the second buried layer, resulting in no irregular reflection of the laser light in the window structure. Consequently, deterioration of the beam shape of laser light emitted from the window structure can be reliably suppressed, whereby a semiconductor optical device in which satisfactory connection to an optical system is possible is fabricated.

Further, since the laser light radially propagated is prevented from leaking out of the window structure by gradually increasing the mesa width of the window structure corresponding to the radiant angle of the laser light, the size of the window structure is reduced to a minimum. As a result, an increase in electric capacity with an increase in size of the window structure can be suppressed, which does not exert a noticeable bad influence on high-speed operation of the light modulator region.

DETAILED DESCRIPTION OF THE PREFERRED EMBODIMENT

A description is given of an embodiment of the present invention.

Figure 1:
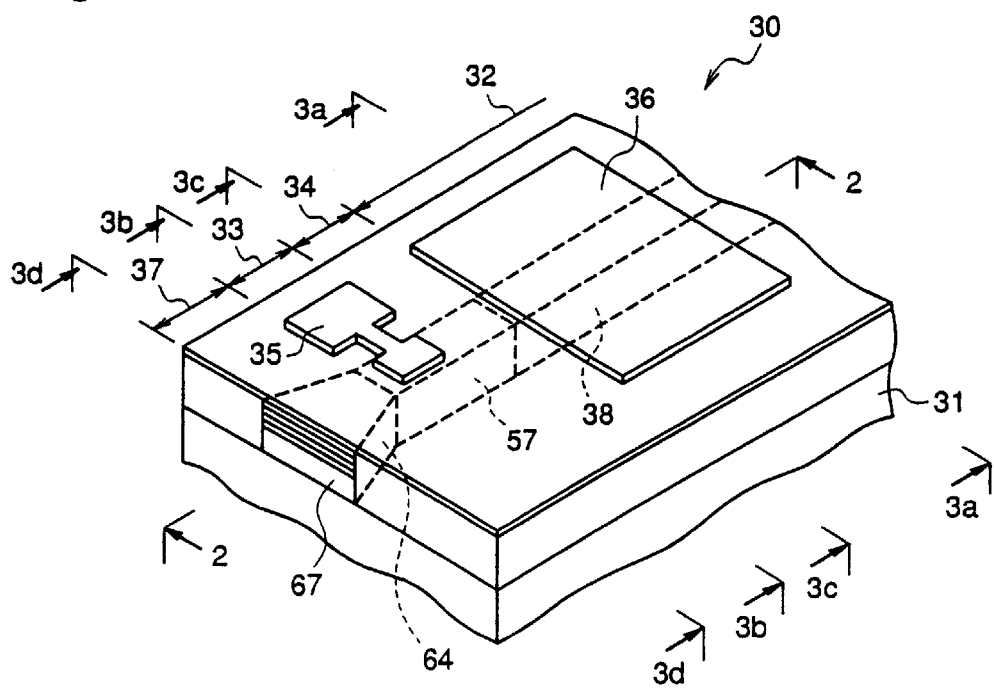
FIG. 1 is a schematic perspective view illustrating a principal part of a semiconductor optical device according to an embodiment of the present invention.
Figure 2:
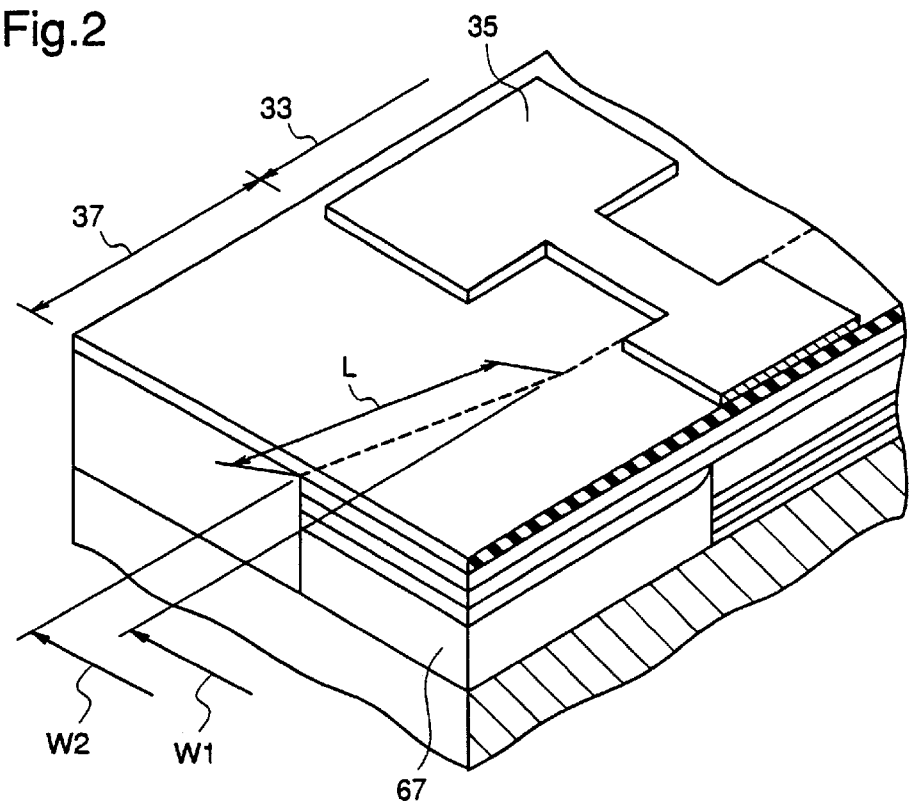
FIG. 2 is an enlarged schematic perspective view illustrating a part of the semiconductor optical device that is cut along a virtual plane 2—2 shown in FIG. 1.

FIG. 1 is a perspective view illustrating a principal part of a semiconductor optical device according to an embodiment of the present invention. FIG. 2 is an enlarged perspective view illustrating a part of the semiconductor optical device that is cut along a virtual plane 2—2 shown in FIG. 1. FIGS. 3(a)–3(d) are cross-sectional views of the semiconductor optical device that are taken along virtual planes 3a—3a, 3b—3b, 3c—3c, and 3d—3d shown in FIG. 1, respectively.

Referring to FIGS. 1 and 2, a semiconductor optical device 30 has a semiconductor laser region 32 and a light modulator region 33 on a semiconductor substrate (hereinafter referred to as a substrate) 31. These semiconductor laser region and light modulator region constitute a semiconductor laser and a light modulator, respectively. That is, the semiconductor optical device 30 comprises the semiconductor laser 32 and the light modulator 33 that are integrated on the substrate 31. Further, an isolation region 34 is located between the semiconductor laser 32 and the light modulator 33. An electrode for light modulator 35 is placed at the light modulator 33, and an electrode for semiconductor laser 36 is placed at the semiconductor laser 32.

The semiconductor laser 32 according to the embodiment of the present invention is a so-called distributed feedback laser (DFB-LD) having a diffraction grating (not shown). This semiconductor laser 32 is made so as to emit laser light with a wavelength of 1.55 µm. Generally in such a distributed feedback laser, light wavelength easily varies due to light reflected at a light emitting facet. For this reason, the semiconductor optical device 30 according to the embodiment of the present invention has a window region 37. Since the semiconductor optical device 30 includes the light modulator 33, the window region 37 is provided continuously with the light modulator 33. While the semiconductor laser 32 and the light modulator 33 include optical waveguide portions (not shown in FIG. 1), the window region 37 includes no such optical waveguide portion as described below. Therefore, when light emitted from the light modulator 33 passes through the window region 37, the light is propagated radially.

The semiconductor optical device 30 according to this embodiment is characterized as follows. The window region 37 has a mesa-shaped window structure 64. The semiconductor laser 32 and the light modulator 33 have a first optical waveguide mesa structure 38 and a second optical waveguide mesa structure 57 having optical waveguides, respectively. The embodiment of the present invention is characterized by that the mesa width W2 of the window structure 64 is set to be larger than the mesa width W1 of the second optical waveguide mesa structure 57.

A further detailed description is given of the structure of the semiconductor optical device 30.

Referring to FIG. 3(a), the semiconductor laser 32 has the first optical waveguide mesa structure 38. The first optical waveguide mesa structure 38 comprises a first optical waveguide portion 39, first current blocking layers 40 that are adjacent to both sides of the first optical waveguide portion 39, a cladding layer 49, and a contact layer 41. Further, layers 52 bury both sides of the first optical waveguide mesa structure 38 (hereinafter referred to as burying layers). In the embodiment of the present invention, the mesa width W1 of the first optical waveguide mesa structure 38 is set to 10 μm.

The first optical waveguide portion 39 comprises a plurality of semiconductor layers. More specifically, the first optical waveguide portion 39 comprises a buffer layer 42 serving as a lower cladding layer, a first light confinement layer 43, an active layer 44, a second light confinement layer 45, a first upper cladding layer 46, a diffraction grating layer 47, and a second upper cladding layer 48 that are successively disposed on the substrate 31. The width d1 of the first optical waveguide portion 39 is 1.3 μm.

In the embodiment of the present invention, n type InP is used as a material of the substrate 31. The thickness of the substrate 31 is 100 μm. The refractive index to laser light of the substrate 31 is 3.17.

The buffer layer 42 comprises n type InP. Although the thickness of the buffer layer 42 is 5 μm in the embodiment of the present invention, it may be in a range of 0.5–5 μm. The refractive index of laser light to the buffer layer 42 is 3.17.

The first light confinement layer 43 comprises n type InGaAsP. The thickness of the first light confinement layer 43 is 65 nm. The refractive index to laser light of the first light confinement layer 43 is 3.33.

The active layer 44 has a multiple quantum well structure. More specifically, the active layer 44 comprises InGaAs layers and InGaAsP layers that are alternately laminated. The thickness of the InGaAs layer is 7.5 nm, and the thickness of the InGaAsP layer is 6.0 nm. The refractive index to laser light of the InGaAs layer is 3.54, and the refractive index to laser light of the InGaAsP layer is 3.33. The refractive index to laser light of the whole of the active layer 44 including the InGaAs layer and the InGaAsP layer is 3.23.

The second light confinement layer 45 comprises p type InGaAsP. The thickness of the second light confinement layer 45 is 65 nm. The refractive index to laser light of the second light confinement layer 45 is 3.33.

The first upper cladding layer 46 comprises p type InP. The thickness of the first upper cladding layer 46 is 300 nm. The refractive index to laser light of the first upper cladding layer 46 is 3.17.

The diffraction grating layer 47 comprises p type InGaAsP. The thickness of the diffraction grating layer 47 is 40 nm. The refractive index to laser light of the diffraction grating layer 47 is 3.33.

The second upper cladding layer 48 comprises p type InP. The thickness of the second upper cladding layer 48 is 300 nm. The refractive index to laser light of the second upper cladding layer 48 is 3.17.

The first current blocking layer 40 comprises an Fe-doped InP layer 50 and an n type InP hole trap layer 51 that are successively laminated. The thickness of the Fe-doped InP layer 50 is 3 μm. The refractive index to laser light of the Fe-doped InP layer 50 is 3.17. The thickness of the n type InP hole trap layer 51 is 0.5 μm. The refractive index to laser light of the n type InP hole trap layer 51 is 3.17.

The cladding layer 49 comprises the same material as that of the second upper cladding layer 48, i.e., p type InP. The thickness of the cladding layer 49 is 3.5 μm. The refractive index to laser light of the cladding layer 49 is 3.17.

The contact layer 41 comprises p type InGaAs. The thickness of the contact layer 41 is 1 μm. The refractive index to laser light of the contact layer 41 is 3.54.

The burying layer 52 comprises polyimide. The thickness of the polyimide layer 52 is 5 μm. The refractive index to laser light in the polyimide layer 52 is 1.8.

In addition, an $SiO_2$ film 53 is disposed between the polyimide layer 52 and the first optical waveguide mesa structure 38.

An $SiO_2$ film 54 is disposed at the upper surface of the semiconductor laser 32. The thicknesses of the $SiO_2$ films 53 and 54 are 0.2 μm, respectively. The refractive indices to laser light of the $SiO_2$ films 53 and 54 are both 1.46. Further, an opening 55 opens in the center of these $SiO_2$ films 53 and 54, and the electrode 36 for semiconductor laser is disposed on the $SiO_2$ film 54. The electrode 36 for semiconductor laser is electrically connected to the contact layer 41 through this opening 55.

The electrode 36 for the semiconductor laser comprises a Ti layer and an Au layer that are successively laminated. The Au layer at the electrode surface is Au-plated. The thickness of the electrode 36 for semiconductor laser is 2 μm.

An electrode 56 is placed at the lower surface of the semiconductor laser 32. This electrode 56 comprises an AuGe layer, an Ni layer, a Ti layer, a Pt layer, a Ti layer, a Pt layer, and an Au layer that are successively laminated. The total thickness of the laminated layers is 410 nm. The Au layer at the electrode surface is Au-plated. The thickness of the plated Au is 2 μm.

Referring to FIG. 3(b), the light modulator 33 has the second optical waveguide mesa structure 57. The second optical waveguide mesa structure 57 is continuous with the first optical waveguide mesa structure 38 of the semiconductor laser 32 through a third optical waveguide mesa structure 61 described later (refer to FIG. 3(c)). The mesa width W1 of the second optical waveguide mesa structure 57 is 10 μm, which is the same width as that of the first optical waveguide mesa structure 38. In FIG. 3(b), the same reference numerals as shown in FIG. 3(a) designate the same parts, and no description is given thereof.

The second optical waveguide mesa structure 57 comprises a second optical waveguide portion 58, second current blocking layers 59 that are adjacent to both sides of the second optical waveguide portion 58, the cladding layer 49, and the contact layer 41. Further, the buried layers 52 are disposed on both sides of the second optical waveguide mesa structure 57.

The second optical waveguide portion 58 comprises a plurality of semiconductor layers. The width d1 of the second optical waveguide portion 58 is 1.3 μm, as in the case of the first optical waveguide portion 39. More specifically, the second optical waveguide portion 58 comprises the buffer layer 42 serving as a lower cladding layer, the first light confinement layer 43, the active layer 44, the second light confinement layer 45, the first upper cladding layer 46, and the second upper cladding layer 48 that are successively disposed on the substrate 31. That is, the second optical waveguide portion 58 includes no diffraction grating layer 47. In addition, the second current blocking layer 59 has the same structure as that of the first current blocking layer 40.

The SiO$_2$ film 54 is disposed at the upper surface of the light modulator 33. Further, an opening 60 opens in the center of the SiO$_2$ film 54, and the electrode 35 for the light modulator is disposed on the SiO$_2$ film 54. The electrode 35 for light modulator is electrically connected to the contact layer 41 through this opening 60.

The electrode 35 for light modulator comprises a Ti layer and an Au layer that are successively laminated, i.e., the same materials as those of the electrode 36 for the semiconductor laser. The Au layer at the electrode surface is Au-plated. The thickness of the electrode 35 for the light modulator is 2 $\mu$m.

Referring to FIG. 3(c), the isolation region 34 has a third optical waveguide mesa structure 61. The third optical waveguide mesa structure 61 is continuous with the first optical waveguide mesa structure 38 of the semiconductor laser 32. The mesa width W1 of the third optical waveguide mesa structure 61 is 10 $\mu$m, which is the same width as that of the first optical waveguide mesa structure 38. In FIG. 3(c), the same reference numerals as shown in FIG. 3(a) designate the same parts, and no description is given thereof.

The third optical waveguide mesa structure 61 comprises a third optical waveguide portion 62, and a third current blocking layer 63 that is disposed contacting both sides of the third optical waveguide portion 62. Further, a burying layer 65 is disposed on both sides of the third optical waveguide mesa structure 61.

The third optical waveguide portion 62 comprises a plurality of semiconductor layers. The width d1 of the third optical waveguide portion 62 is 1.3 $\mu$m, as in the case of the first optical waveguide portion 39. More specifically, the third optical waveguide portion 62 comprises the buffer layer 42 serving as a lower cladding layer, the first light confinement layer 43, the active layer 44, the second light confinement layer 45, the first upper cladding layer 46, and the second upper cladding layer 48 that are successively disposed on the substrate 31. That is, the third optical waveguide portion 62 has the same structure as that of the second optical waveguide portion 58, and includes no diffraction grating layer 47.

The third current blocking layer 63 has the same structure as those of the first and second current blocking layers 40 and 59, except that the continuous n type InP hole trap layer 51 is disposed on the third optical waveguide portion 62.

The burying layer 65 comprises the same material as that of the burying layer 52. This burying layer 65 is continuous over the third optical waveguide mesa structure 61. Since the continuous portion of the burying layer 65 is thin, the isolation between the semiconductor laser 32 and the light modulator 33 is secured. The SiO$_2$ film 54 is disposed at the upper surface of the isolation region 34.

Referring to FIG. 3(d), the window region 37 has a mesa-shaped window structure 64, and the burying layers 52 are disposed on both sides of the window structure 64. The window structure 64 is continuous with the second optical waveguide mesa structure 57 of the light modulator 33. The mesa width W2 of the window structure 64 is larger than the mesa width W1 of the second optical waveguide mesa structure 57. In this embodiment of the present invention, the length L of the window structure 64 is 20 $\mu$m. This length L may be varied according to the use of the semiconductor optical device 30.

More specifically, the mesa width W2 of the window structure 64 may be 20 $\mu$m or less. In the embodiment of the present invention, the window structure 64 has a funnel shape. That is, the mesa width W2 of the window structure 64 at a laser light emitting facet 67 (refer to FIG. 2) is 20 $\mu$m, and this mesa width W2 gradually decreases to the mesa width W1 (10 $\mu$m) of the second optical waveguide mesa structure 57 of the light modulator 33.

The reason why the mesa width W2 of the window structure 64 at the facet 67 is 20 $\mu$m will be described.

The size W1 of the second optical waveguide mesa structure 57 through which laser light passes and the size d1 of the second optical waveguide portion 58 are set to 10 $\mu$m and 1.3 $\mu$m, respectively, according to requests for satisfying the use of the semiconductor optical device 30. That is, in order to realize required performance of a semiconductor optical device to be fabricated, these sizes W1 and d1 can be set arbitrarily.

Figure 4:
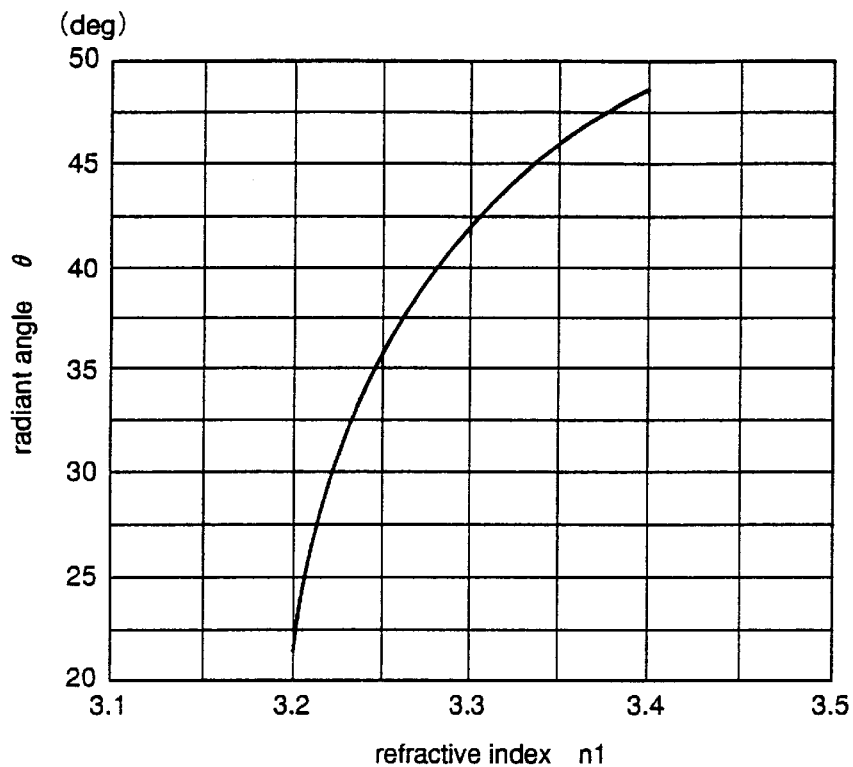
FIGS. 4(*a*) and 4(*b*) are graphs showing the relation between the radiant angle $\theta$ of laser light at a window structure and a refractive index n1 of an active layer, and the relation between the refractive index n1 of the active layer and a width W2 of the window structure, respectively.
Figure 4:
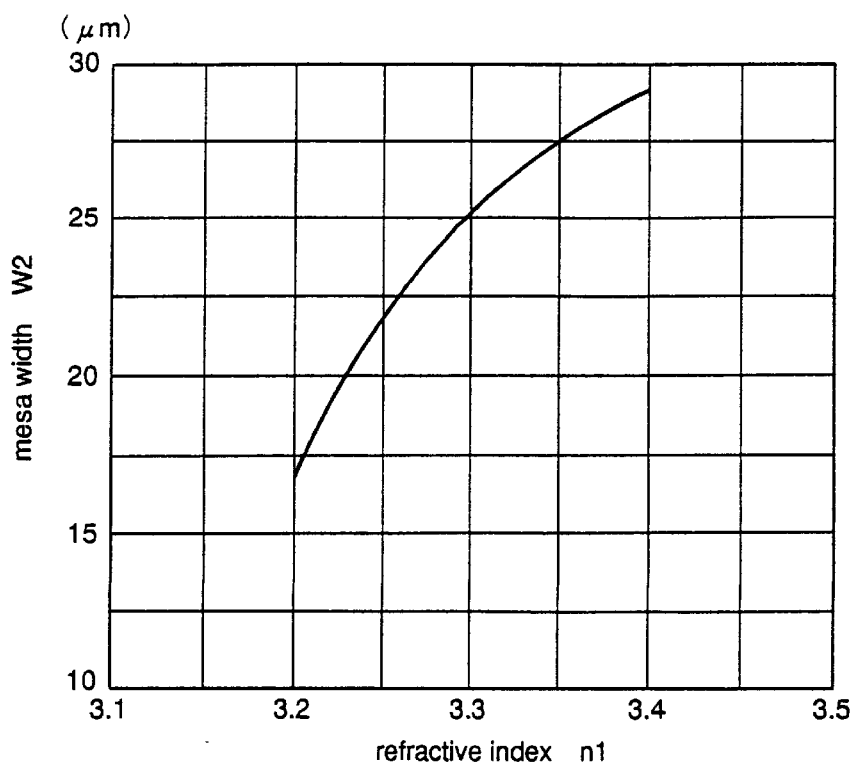
Figure 5:
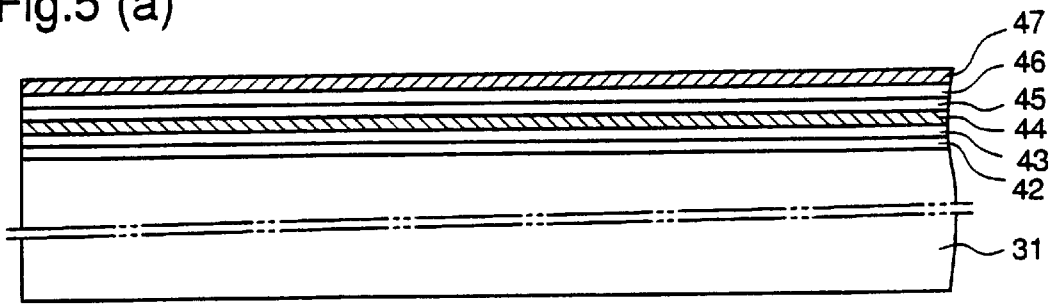
FIGS. 5(a) and 5(b) are a front view and a left side view illustrating a semiconductor laminated structure during a first multilayer structure fabricating process.
Figure 5:
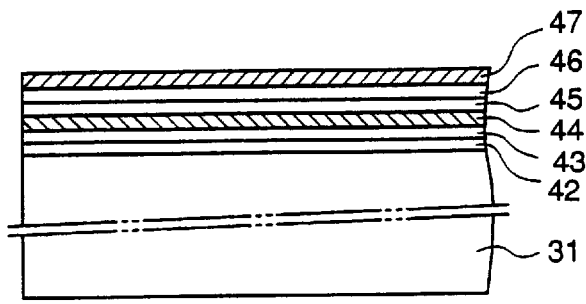
Figure 6:
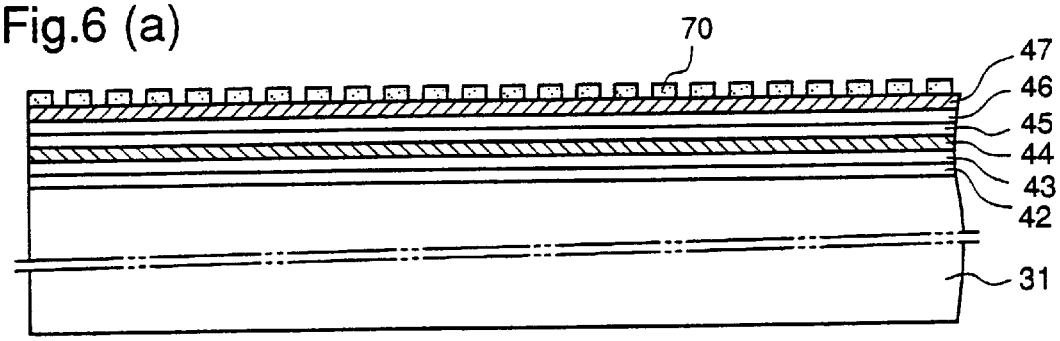
FIGS. 6(a) and 6(b) are a front view and a left side view illustrating a semiconductor laminated structure during the first multilayer structure fabricating process.
Figure 6:
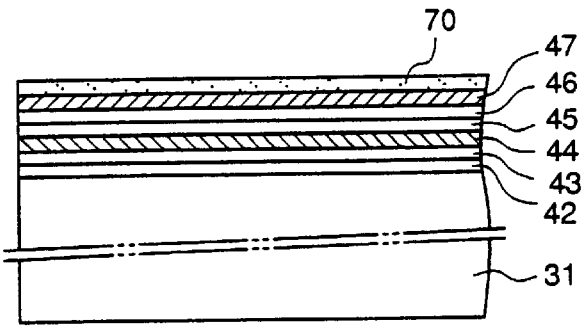
Figure 7:
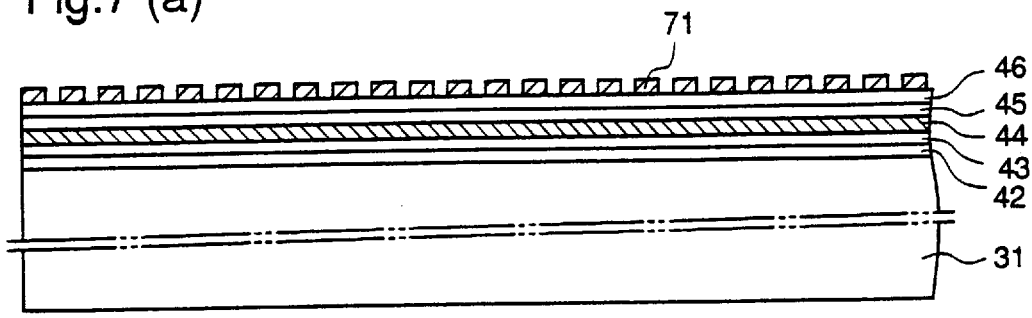
FIGS. 7(a) and 7(b) are a front view and a left side view illustrating a semiconductor laminated structure during the first multilayer structure fabricating process.
Figure 7:
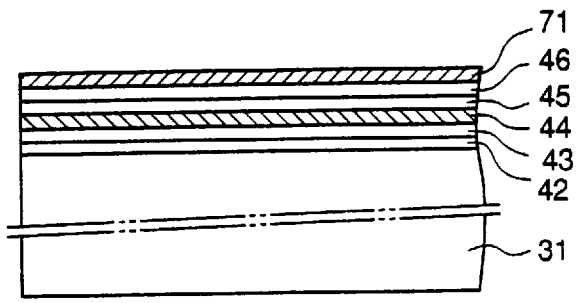
Figure 8:
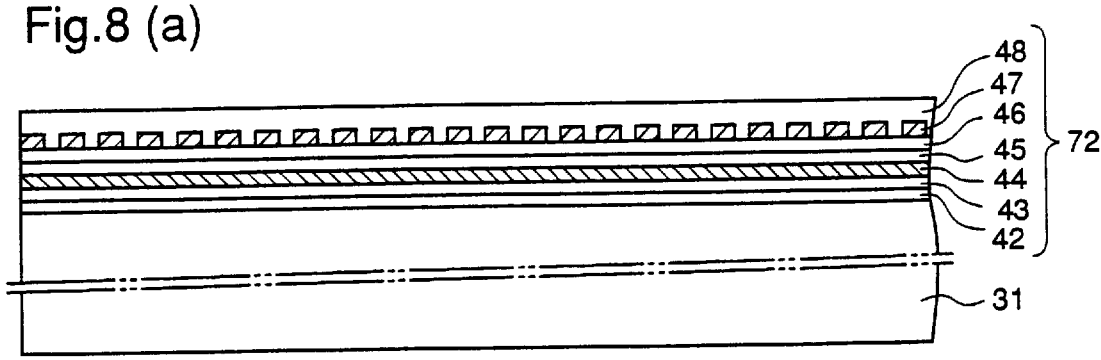
FIGS. 8(a) and 8(b) are a front view and a left side view illustrating a semiconductor laminated structure during the first multilayer structure fabricating process.
Figure 8:
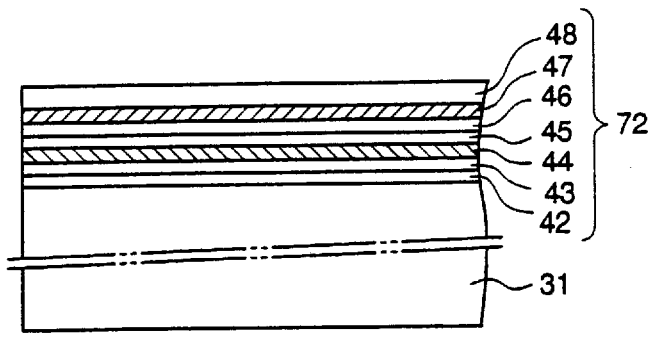
Figure 9:
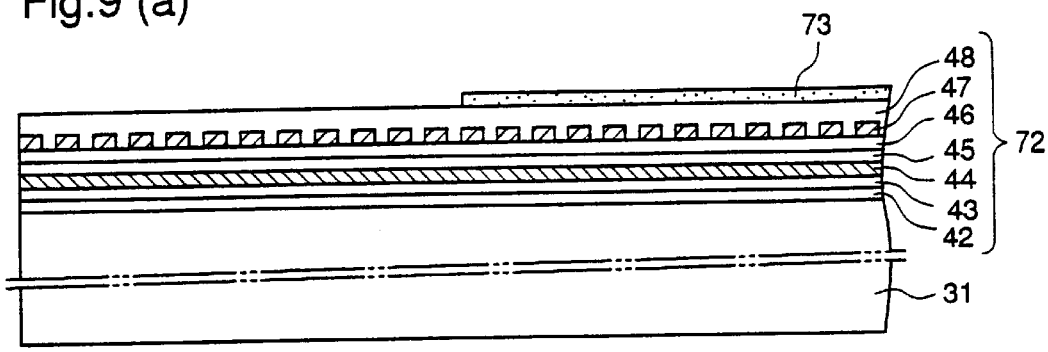
FIGS. 9(a) and 9(b) are a front view and a left side view illustrating a semiconductor laminated structure during a first etching process.
Figure 9:
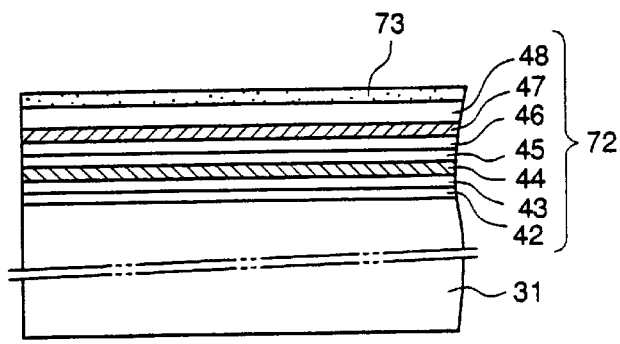
Figure 10:
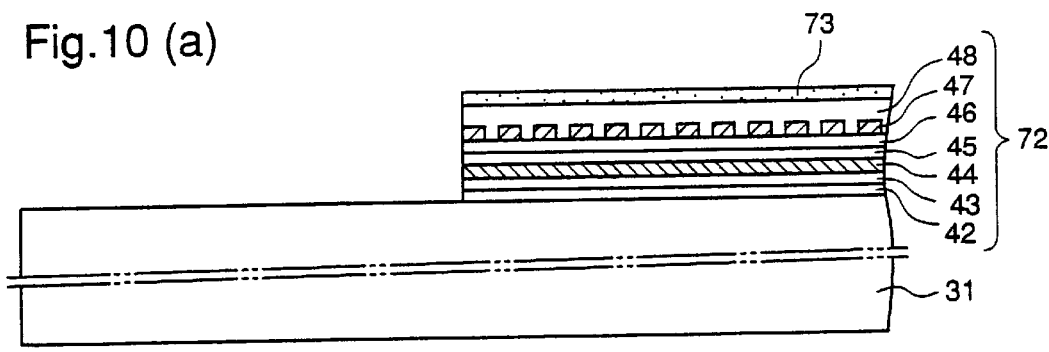
FIGS. 10(a) and 10(b) are a front view and a left side view illustrating a semiconductor laminated structure during the first etching process.
Figure 10:
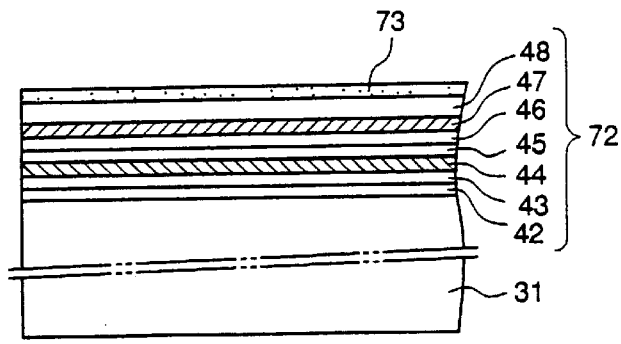
Figure 11:
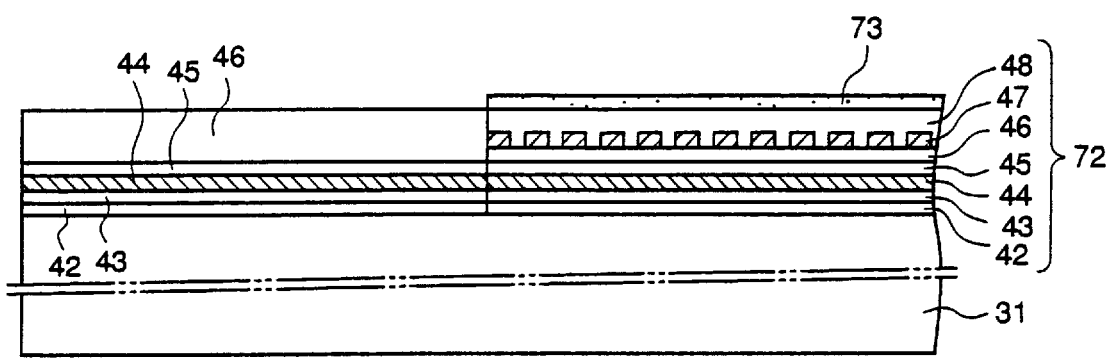
FIGS. 11(a) and 11(b) are a front view and a left side view illustrating a semiconductor laminated structure during a second multilayer structure fabricating process.
Figure 11:
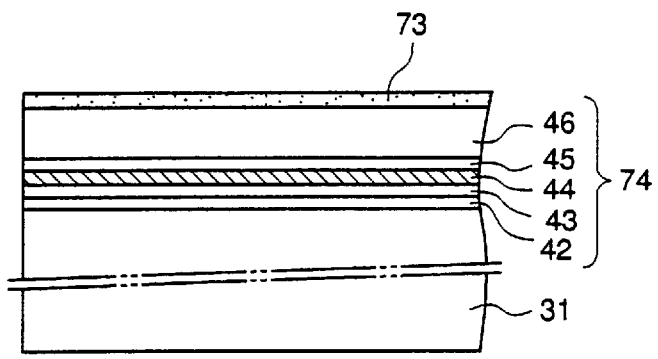
Figure 12:
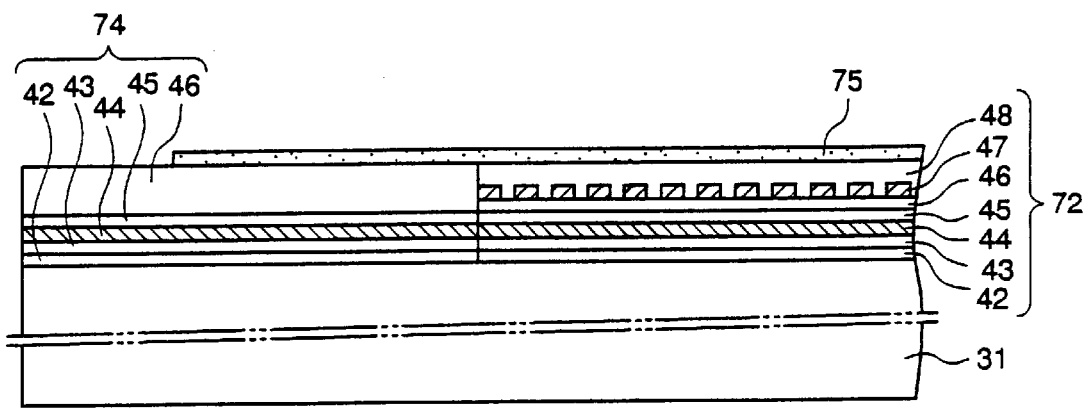
FIGS. 12(a) and 12(b) are a front view and a top plan view illustrating a semiconductor laminated structure during a second etching process.
Figure 12:
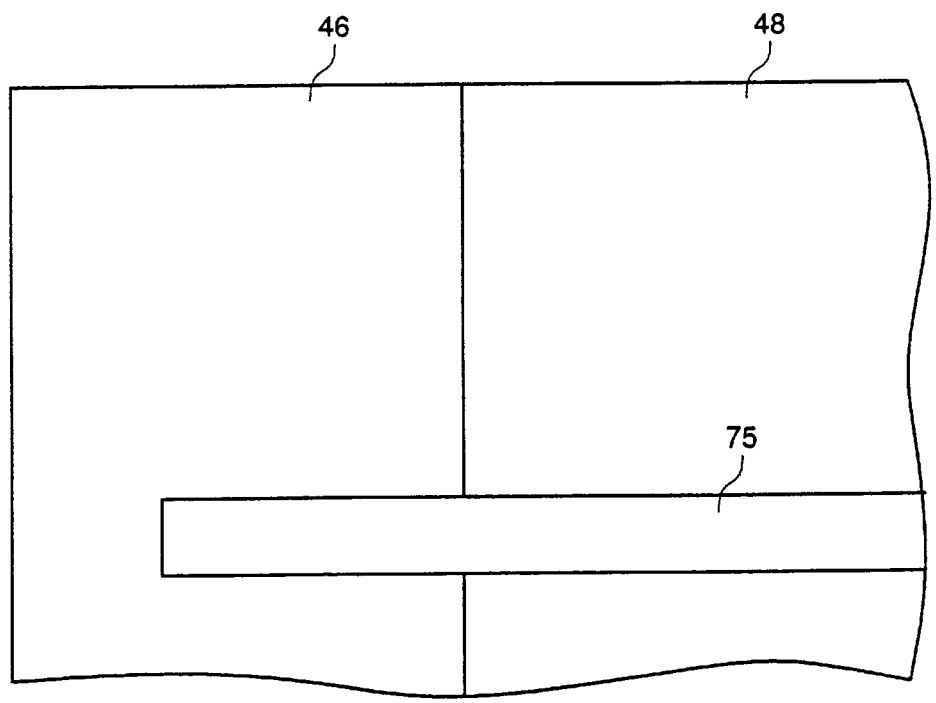
Figure 13:
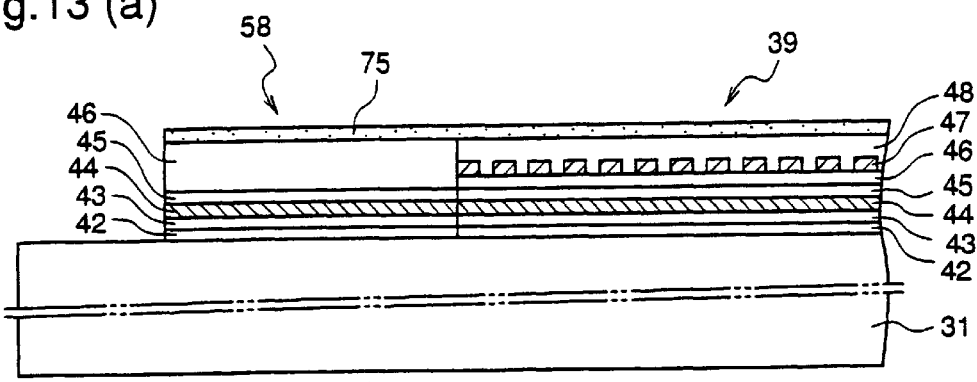
FIGS. 13(a) and 13(b) are a front view and a left side view illustrating a semiconductor laminated structure during the second etching process.
Figure 13:
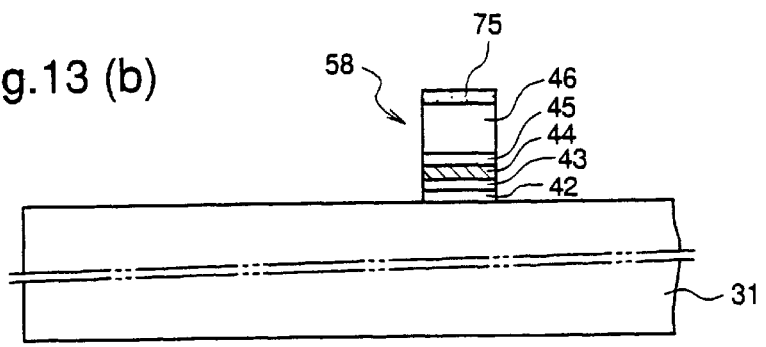
Figure 14:
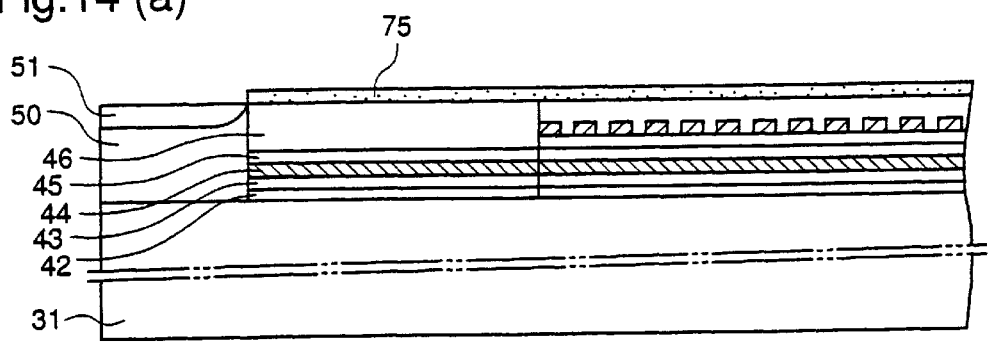
FIGS. 14(a) and 14(b) are a cross-sectional view and a left side view illustrating a semiconductor laminated structure during a first buried layer forming process.
Figure 14:
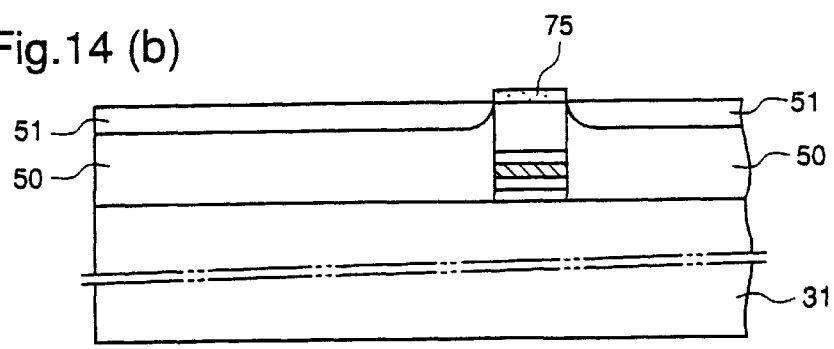
Figure 15:
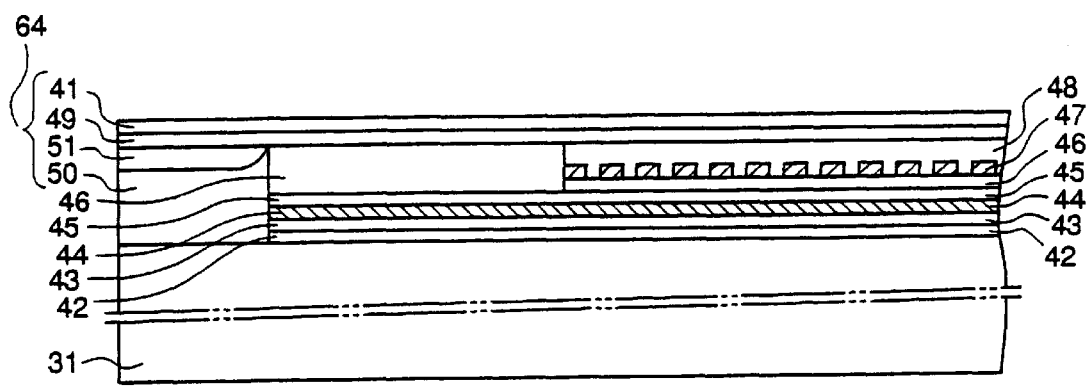
FIGS. 15(a) and 15(b) are a cross-sectional view and a left side view illustrating a semiconductor laminated structure during the first buried layer forming process.
Figure 15:
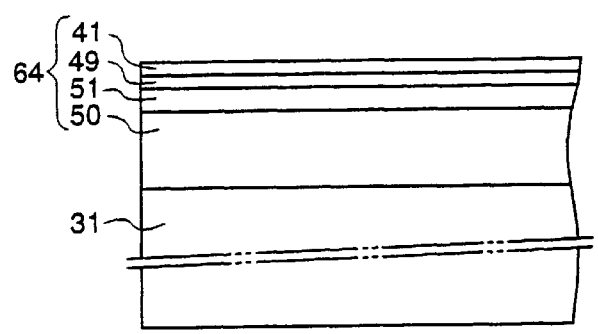
Figure 16:
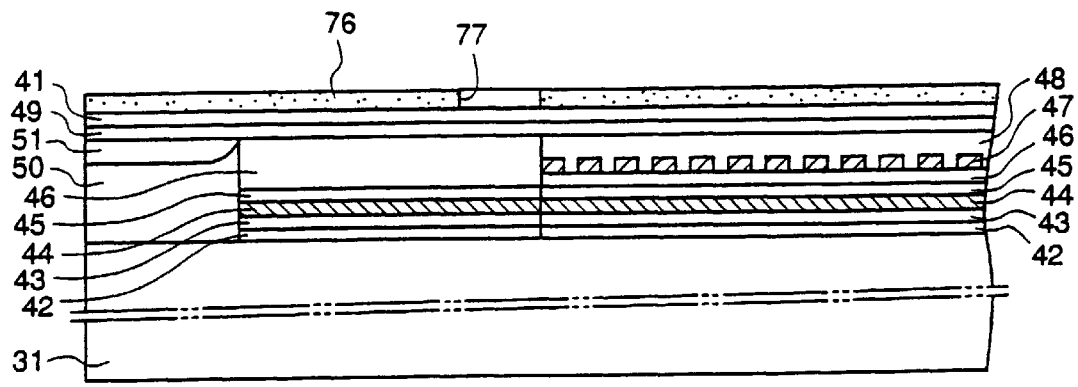
FIGS. 16(a) and 16(b) are a cross-sectional view and a top plan view illustrating a semiconductor laminated structure during the first buried layer forming process.
Figure 16:
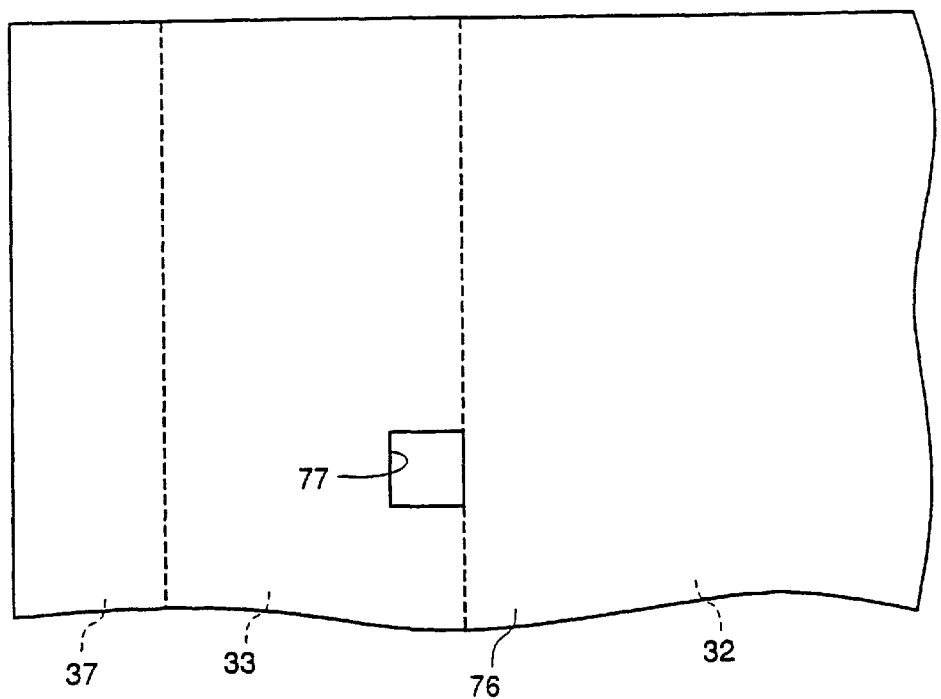

When the refractive index of the active layer 44 is n1 and the refractive index of the first upper cladding layer 46 is n2, the relation between the radiant angle $\theta$ of laser light at the window structure 64 and the refractive index n1 of the active layer 44 is as shown in FIG. 4(a). Here, the radiant angle of laser light is an angle in the direction parallel to the substrate 31 with respect to the normal line of the laser light emitting facet 67. In the embodiment of the present invention, since the refractive index n1 is 3.23 and the refractive index n2 is 3.17, it is found from FIG. 4(a) that the radiant angle $\theta$ of laser light is approximately 33°.

Meanwhile, when the radiant angle of laser light is $\theta$ and the length of the window structure 64 is L, assuming that the loss of laser light at the window structure 64 is 10%, the width W2 of the window structure 64 at the emitting facet 67 is obtained from a relational expression, $W2 = 2L\tan(1.4\theta/2)$. Therefore, by substituting the above-described values for $\theta$ and L in the expression, the width W2 becomes 20 $\mu$m.

In the embodiment of the present invention, the above-described sizes and values may be varied according to the uses of the semiconductor optical device 30. Also in such a case, the radiant angle $\theta$ of laser light and the width W2 of the window structure 64 can be decided by using the same method as described above. In addition, the relation between the refractive index n1 of the active layer 44 and the width W2 of the window structure 64 is as shown in FIG. 4(b).

A description is given of a method of fabricating the semiconductor optical device 30, referring to FIGS. 5(a) and 5(b) to 24(a) and 24(b). In these figures, FIGS. 5(a) to 24(a) are front views of semiconductor laminated structures during respective fabrication processes, and FIGS. 5(b) to 24(b) are left side views thereof, as long as no special notices are given.

The method of fabricating the semiconductor optical device 30 according to the embodiment of the present invention includes a first multilayer structure fabricating process, a first etching process, a second multilayer structure fabricating process, a second etching process, a first buried layer forming process, a third etching process, and a second buried layer forming process. The respective processes will be described in detail.

(1) First multilayer structure fabricating process

This process is for fabricating a first multilayer structure 72 including the active layer (first active layer) 44 and the diffraction grating layer 47 of the semiconductor laser 32 on the substrate 31.

As shown in FIGS. 5(a) and 5(b), the n type InP buffer layer 42, the n type InGaAsP first light confinement layer 43, the InGaAs/InGaAsP multiple quantum well layer 44, the p type InGaAsP second light confinement layer 45, the p type InP first upper cladding layer 46, and the p type InGaAsP diffraction grating layer 47 are successively grown on the substrate 31.

Next, with reference to FIGS. 6(a) and 6(b), a resist pattern 70 for forming a diffraction grating of the semiconductor laser 32 is formed on the p type InGaAsP diffraction grating layer 47. Then, using the resist pattern 70 as a mask, etching is performed to the diffraction grating layer 47, thereby forming a diffraction grating 71 as shown in FIGS. 7(a) and 7(b). This diffraction grating 71 comprises the diffraction grating layer 47. In this case, for example, dry etching using a gas mixture of $CH_4$ and $H_2$, i.e., RIE (reactive ion etching), is used as the etching process. Thereafter, with reference to FIGS. 8(a) and 8(b), the p type InP second upper cladding layer 48 is grown over the diffraction grating layer 47.

For example, MOCVD (metal organic chemical vapor deposition) is used as a method for growing the respective layers. However, any other generally known method may be employed as long as the respective layers are grown by the method. The thicknesses of the respective layers may be set as described above. In this way, the first multilayer structure 72 is fabricated on the substrate 31.

(2) First etching process

This process is for etching and removing regions of the first multilayer structure 72 where the light modulator 33 and the window region 37 are to be formed.

As shown in FIGS. 9(a) and 9(b), a resist pattern 73 is formed on a region of the first multilayer structure 72, except the regions where the light modulator 33 and the window region 37 are to be formed. Then, the first multilayer structure 72 is selectively etched using the resist pattern 73 as a mask, thereby removing the regions of the first multilayer structure 72 where the light modulator 33 and the window region 37 are to be formed, as shown in FIGS. 10(a) and 10(b). That is, the substrate 31 is exposed in these regions. In this case, for example, dry etching using a gas mixture of $CH_4$ and $H_2$, i.e., RIE, is used as the etching process.

(3) Second multilayer structure fabricating process

This process is for filling spaces that have been produced by the first etching process with a second multilayer structure 74 including the active layer (second active layer) 44 of the light modulator 33.

As shown in FIGS. 11(a) and 11(b), the n type InP buffer layer 42, the n type InGaAsP first light confinement layer 43, the InGaAs/InGaAsP multiple quantum well layer 44, the p type InGaAsP second light confinement layer 45, and the p type InP first upper cladding layer 46 are successively grown on the substrate 31 at the regions where the light modulator 33 and the window region 37 are to be formed, using the resist pattern 73 as a mask for selective growth. For example, MOCVD is used as a method for growing the respective layers. However, any other generally known method may be employed as long as the respective layers are grown by the method. The thicknesses of the respective layers can be set as described above. In this way, the second multilayer structure 74 is fabricated on the substrate 31.

(4) Second etching process

This process is for etching and removing a region of the second multilayer structure 74 where the window region 37 is to be formed, regions of the second multilayer structure 74 except a region where the second optical waveguide portion 58 of the light modulator 33 is to be formed, and regions of the first multilayer structure 72 except a region where the first optical waveguide portion 39 of the semiconductor laser 32 is to be formed.

FIG. 12(a) is a front view of a semiconductor laminated structure, and FIG. 12(b) is a top plan view thereof. With reference to these figures, after removal of the resist pattern 73, a resist pattern 75 is formed on the first multilayer structure 72 and on the second multilayer structure 74. This resist pattern 75 has a slender rectangular shape as shown in FIG. 12(b). Specifically, the resist pattern 75 is formed on the region of the second multilayer structure 74 where the second optical waveguide portion 58 of the light modulator 33 is to be formed, and on the region of the first multilayer structure 72 where the first optical waveguide portion 39 of the semiconductor laser 32 is to be formed. The width of the resist pattern 75 is 1.3 $\mu$m, corresponding to the widths d1 of the first optical waveguide portion 39 and the second optical waveguide portion 58 to be formed.

Then, as shown in FIGS. 13(a) and 13(b), the first multilayer structure 72 and the second multilayer structure 74 are selectively etched using the resist pattern 75 as a mask, thereby forming the mesa-shaped first optical waveguide portion 39 of the semiconductor laser 32 and the mesa-shaped second optical waveguide portion 58 of the light modulator 33 on the substrate 31. In this case, for example, dry etching using a gas mixture of $CH_4$ and $H_2$, i.e., RIE, is used as the etching process.

(5) First buried layer forming process

This process is for filling spaces that have been produced by the second etching process with specified semiconductor layers. FIG. 14(a) is a cross-sectional view of a semiconductor laminated structure, and FIG. 14(b) is a left side view thereof.

As shown in FIGS. 14(a) and 14(b), using the resist pattern 75 as a mask, semiconductor layers are grown in spaces that have been produced by the second etching process, i.e., regions where the first optical waveguide portion 39 and the second optical waveguide portion 58 are absent. Specifically, the Fe-doped InP layer 50 and the n type InP hole trap layer 51 are successively grown using MOCVD. Then, the resist pattern 75 is removed. Instead of MOCVD, any other generally known method can be employed as long as the respective layers are grown by the method.

FIG. 15(a) is a cross-sectional view of a semiconductor laminated structure, and FIG. 15(b) is a left side view thereof. With reference to these figures, after removal of the resist pattern 75, the p type InP cladding layer 49 and the p type InGaAs contact layer 41 are successively grown on the entire surface of the semiconductor grown layers using MOCVD. As a result, the first buried layer 64 is formed in the region where the window region 37 is to be formed, and the first current blocking layer 40 of the semiconductor laser 32 and the second current blocking layer 59 of the light modulator 33 are formed (refer to FIGS. 3(a), 3(b), 3(d)). Also in this case, any other generally known method can be employed as long as the respective layers are grown by the method.

Further, in this process, the isolation region 34 is formed. FIG. 16(a) is a cross-sectional view of a semiconductor laminated structure, and FIG. 16(b) is a top plan view thereof.

As shown in FIGS. 16(a) and 16(b), a resist pattern 76 having an opening 77 at its specified portion is formed on the contact layer 41. The opening 77 is located between a position corresponding to the second optical waveguide portion 58 and a position corresponding to the first optical waveguide portion 39. Using this pattern 76 as a mask, the contact layer 41 and the cladding layer 49 are selectively etched.

Figure 17:
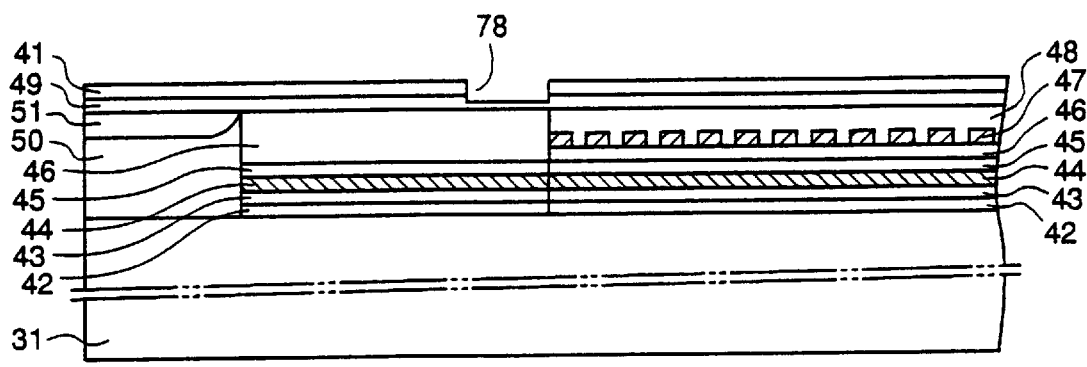
FIGS. 17(a) and 17(b) are a cross-sectional view and a left side view illustrating a semiconductor laminated structure during the first buried layer forming process.
Figure 17:
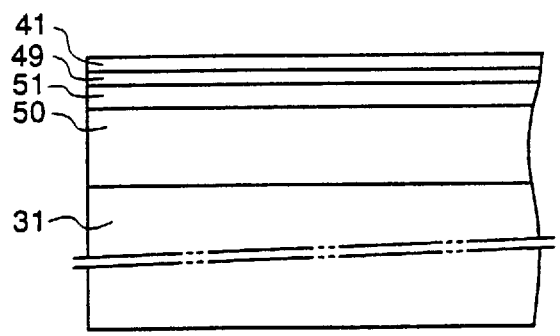

FIG. 17(*a*) is a cross-sectional view of a semiconductor laminated structure, and FIG. 17(*b*) is a left side view thereof. As shown in FIG. 17(*a*), in the etching process, the contact layer 41 and a portion of the cladding layer 49 in the opening 77 of the resist pattern 76 are removed to form a concavity 78. Thereby, the isolation region 34 is formed between the semiconductor laser 32 and the light modulator 33. In this case, for example, dry etching using a gas mixture of $CH_4$ and $H_2$, i.e., RIE, is used as the etching process.

Then, ion implantation is performed to make the cladding layer 49 and the first upper cladding layer 46 have high resistance. In this case, protons are used as the implanted ions, and the ion implantation is performed at an energy of 40–70 KeV and a dose quantity of $10^{13}$–$10^{14}$ $cm^{-2}$.

(6) Third etching process

This process is for forming the first optical waveguide mesa structure 38, the second optical waveguide mesa structure 57, and the window structure 64 by etching processing.

Figure 18:
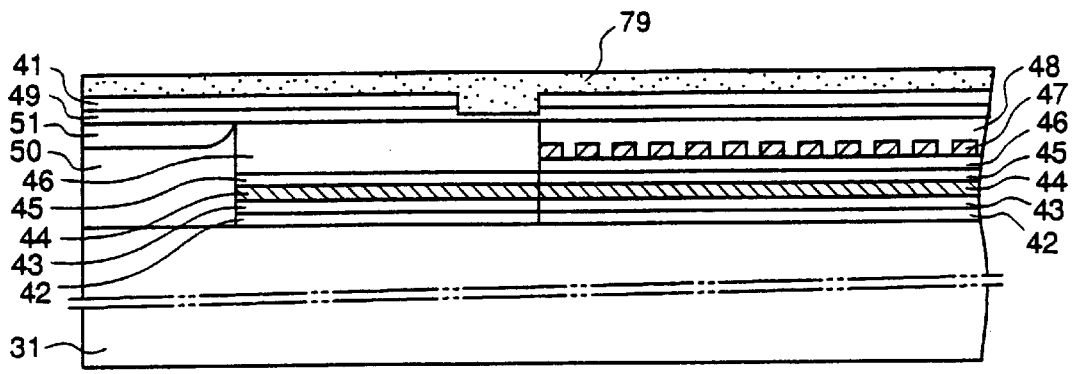
FIGS. 18(a) and 18(b) are a cross-sectional view and a top plan view illustrating a semiconductor laminated structure during a third etching process.
Figure 18:
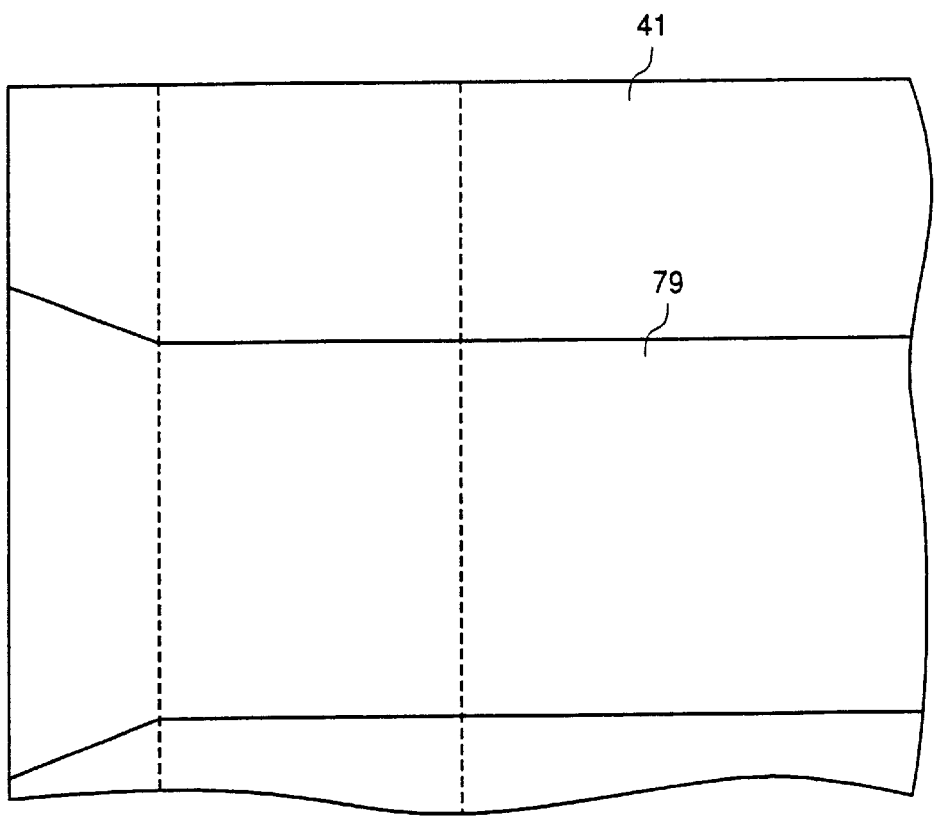

FIG. 18(*a*) is a cross-sectional view of a semiconductor laminated structure, and FIG. 18(*b*) is a top plan view thereof.

With reference to FIGS. 18(*a*) and 18(*b*), initially, a resist pattern 79 is formed on the contact layer 41. This resist pattern 79 has a funnel shape. Specifically, the widths of portions of the resist pattern 79 corresponding to the first optical waveguide mesa structure 38 and the second optical waveguide mesa structure 57 are 12 $\mu$m. Although the mesa widths W1 of the first optical waveguide mesa structure 38 and the second optical waveguide mesa structure 57 are 10 $\mu$m, the widths of the corresponding portions are 12 $\mu$m considering the influence of side etching.

Further, a portion of the resist pattern 79 corresponding to the window structure 64 is radially formed. The greatest width (the width at the left end in FIG. 18(*b*)) is 22 $\mu$m. Although the greatest mesa width W2 of the window structure 64 is 20 $\mu$m, the width of the corresponding portion is 22 $\mu$m considering the influence of side etching. Using this resist pattern 79 as a mask, selective etching is performed to the semiconductor grown layers.

Figure 19:
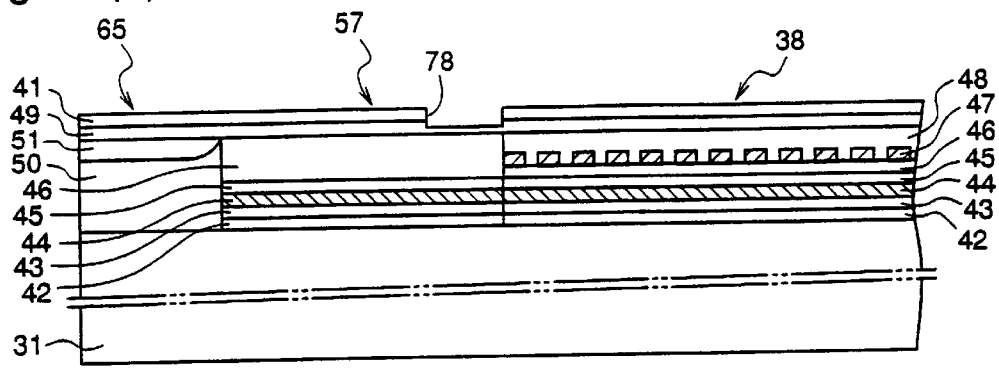
FIGS. 19(a) and 19(b) are a cross-sectional view and a left side view illustrating a semiconductor laminated structure during the third etching process.
Figure 19:
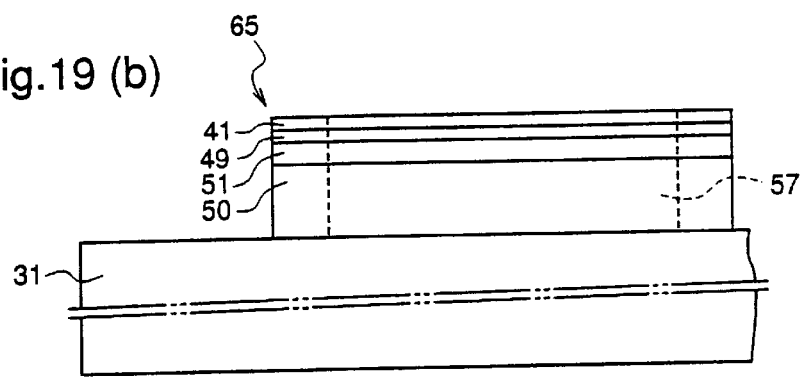

FIG. 19(*a*) is a cross-sectional view of a semiconductor laminated structure, and FIG. 19(*b*) is a left side view thereof. As shown in FIG. 19(*a*), the first optical waveguide mesa structure 38, the second optical waveguide mesa structure 57, and the funnel-shaped window structure 64 are formed by performing the etching process. In this case, for example, dry etching using a gas mixture of $CH_4$ and $H_2$, i.e., RIE, is used as the etching process.

(7) Second buried layer forming process

This process is for filling spaces that have been produced by the third etching process with a second buried layer having a dielectric constant smaller than that of the first buried layer 64.

Figure 20:
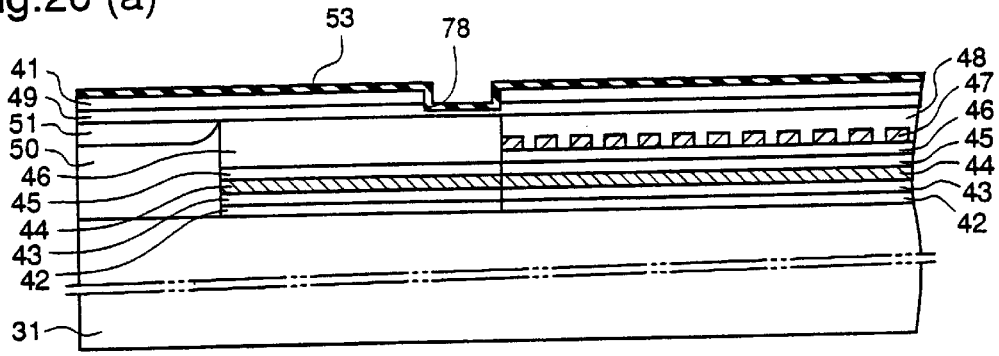
FIGS. 20(a) and 20(b) are a cross-sectional view and a left side view illustrating a semiconductor laminated structure during a second buried layer forming process.
Figure 20:
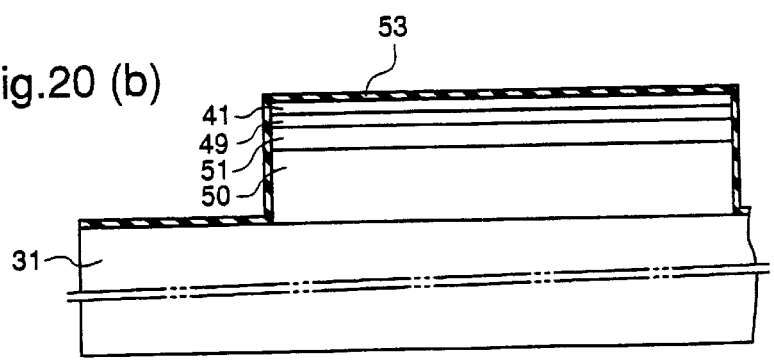

FIG. 20(*a*) is a cross-sectional view of a semiconductor laminated structure, and FIG. 20(*b*) is a left side view thereof.

As shown in FIGS. 20(*a*) and 20(*b*), the $SiO_2$ film 53 is formed over the substrate 31, the first optical waveguide mesa structure 38, the second optical waveguide mesa structure 57, and the window structure 64 using, for example, sputtering technique. The thickness of the $SiO_2$ film 53 is 0.2 $\mu$m.

Figure 21:
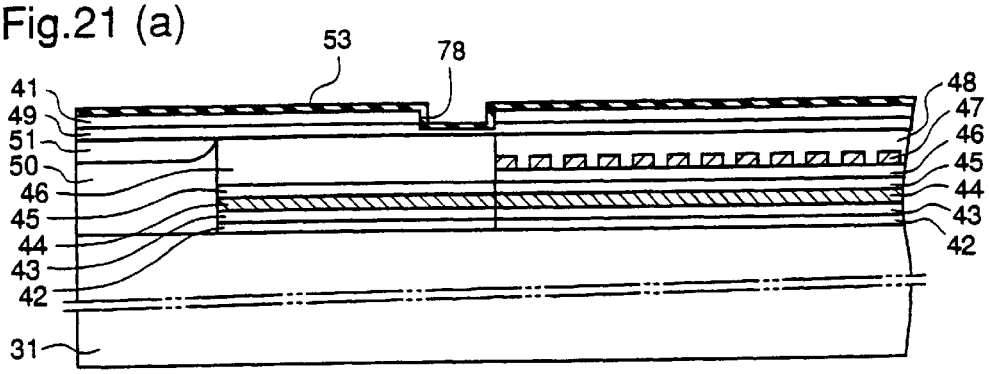
FIGS. 21(a) and 21(b) are a cross-sectional view and a left side view illustrating a semiconductor laminated structure during the second buried layer forming process.
Figure 21:
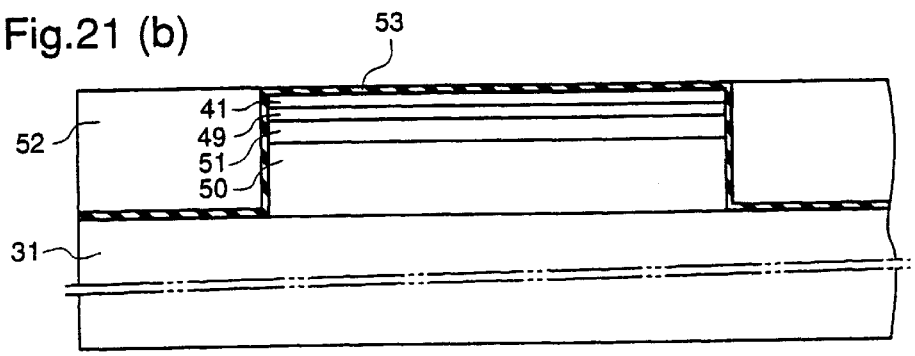

FIG. 21(*a*) is a cross-sectional view of a semiconductor laminated structure, and FIG. 21(*b*) is a left side view thereof. As shown in FIG. 21(*b*), polyimide is deposited on the semiconductor laminated structure at the state shown in FIG. 20(*b*), thereby forming the second buried layer on both sides of the first optical waveguide mesa structure 38, the second optical waveguide mesa structure 57, and the window structure 64. This second buried layer corresponds to the above-described buried layers 52 and 65 (refer to FIGS. 3(*a*)–3(*d*)). For example, a method of coating the entire surface of the substrate with polyimide by a coater, performing heat treatment, and flattening the surface by etching-back is used for forming the second buried layer.

Figure 22:
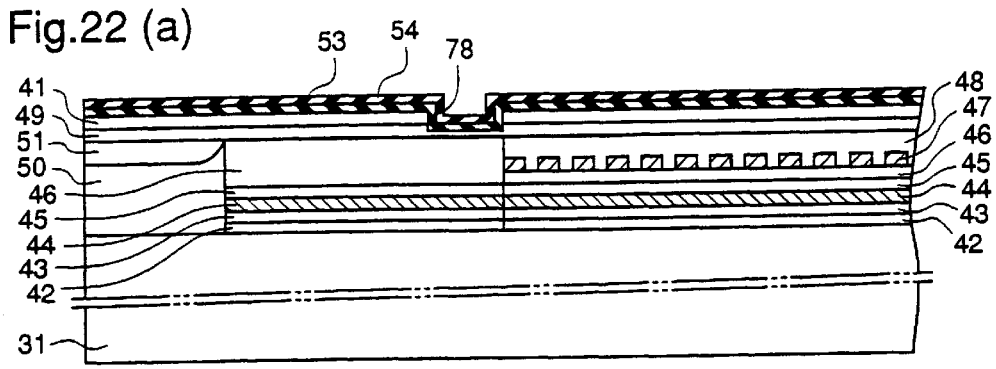
FIGS. 22(a) and 22(b) are a cross-sectional view and a left side view illustrating a semiconductor laminated structure during the second buried layer forming process.
Figure 22:
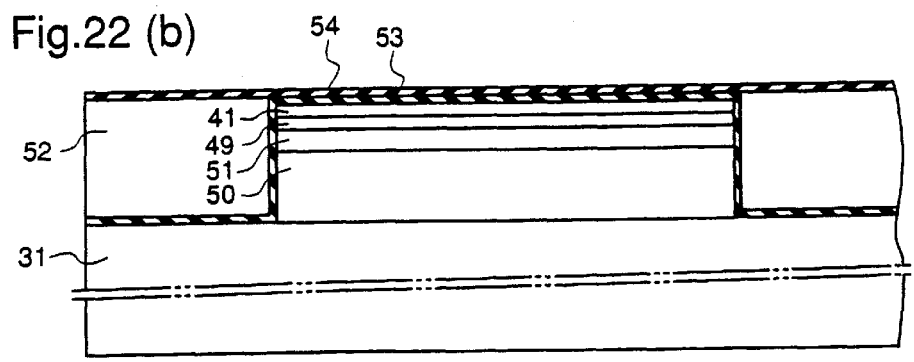

FIG. 22(*a*) is a cross-sectional view of a semiconductor laminated structure, and FIG. 22(*b*) is a left side view thereof. After forming the second buried layer, the $SiO_2$ film 54 is formed over the semiconductor laminated structure shown in FIGS. 21(*a*) and 21(*b*) using, for example, sputtering technique.

Figure 23:
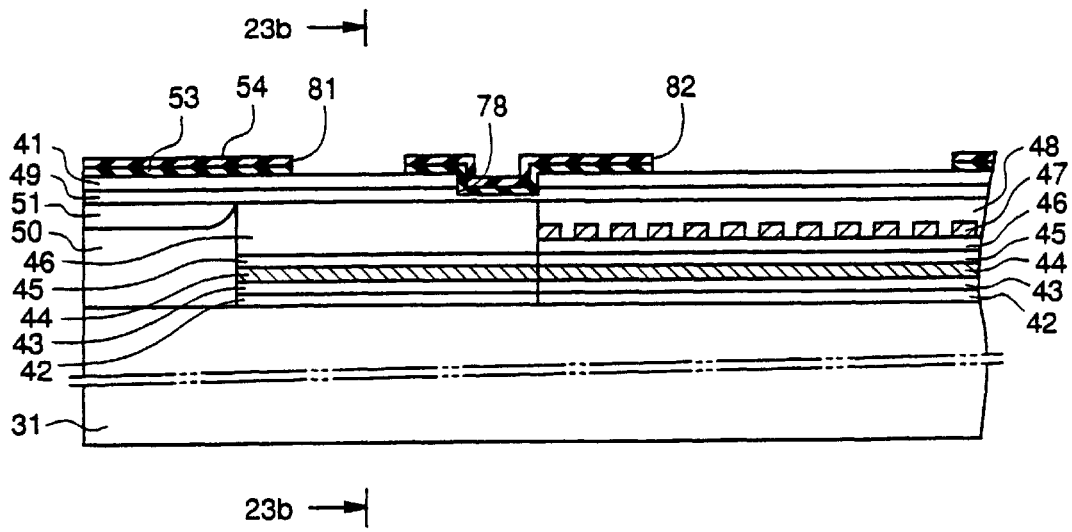
FIGS. 23(a) and 23(b) are cross-sectional views illustrating a semiconductor laminated structure during the second buried layer forming process.
Figure 23:
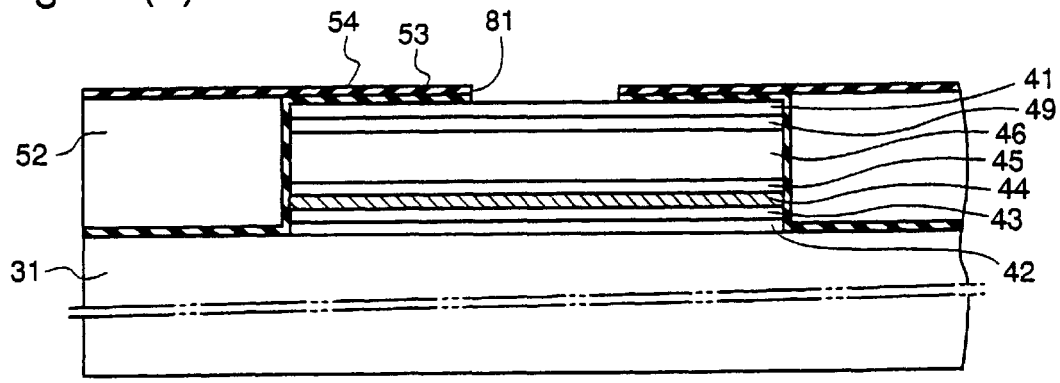

FIG. 23(*a*) is a cross-sectional view of a semiconductor laminated structure, and FIG. 23(*b*) is a cross-sectional view that is taken along a virtual plane 23*b*—23*b* shown in FIG. 23(*a*).

With reference to FIGS. 23(*a*) and 23(*b*), a resist pattern (not shown) having openings at its specified portions is formed on the $SiO_2$ film 54. These openings are located corresponding to positions to be connected to the electrode 35 for light modulator and the electrode 36 for semiconductor laser, respectively (refer to FIG. 1). Using this resist pattern as a mask, the $SiO_2$ films 53 and 54 are selectively etched to form openings 55 and 60.

Figure 24:
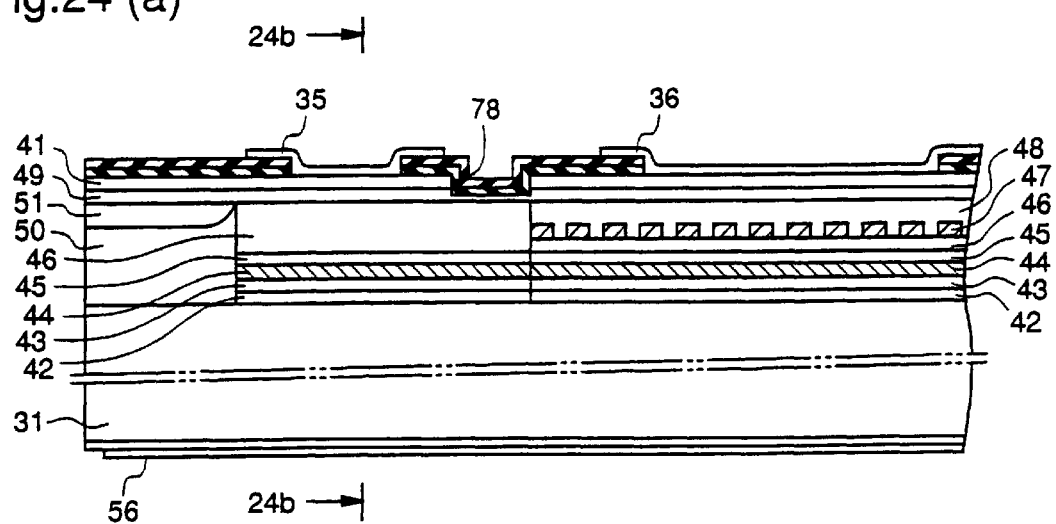
FIGS. 24(a) and 24(b) are cross-sectional views illustrating a semiconductor laminated structure during the second buried layer forming process.
Figure 24:
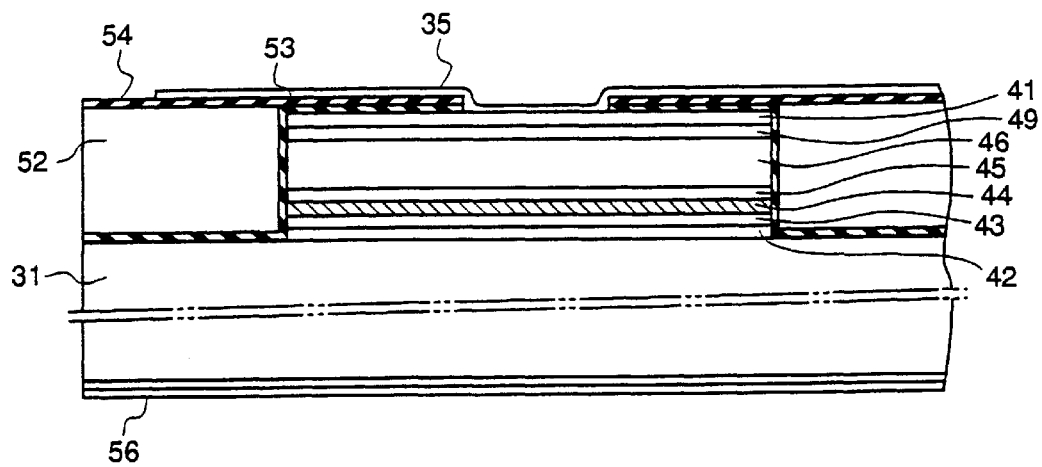

FIG. 24(*a*) is a cross-sectional view of a semiconductor laminated structure, and FIG. 24(*b*) is a cross-sectional view that is taken along a virtual plane 24*b*—24*b* shown in FIG. 24(*a*).

With reference to FIGS. 24(*a*) and 24(*b*), after forming the openings 55 and 60, Ti and Au are successively deposited by evaporation covering the openings 55 and 60, Au is plated, thereby forming the Au-plated electrodes 35 and 36. These electrodes 35 and 36 constitute the electrode 35 for light modulator and the electrode 36 for semiconductor laser, respectively.

Further, an AuGe layer, an Ni layer, a Ti layer, a Pt layer, a Ti layer, a Pt layer, and an Au layer are successively deposited by evaporation on the rear surface of the substrate 31, Au is plated, thereby forming the electrode 56.

Through the respective processes described above, the semiconductor optical device 30 is accomplished.

A description is given of the function and effect of the semiconductor optical device 30 according to the embodiment of the present invention.

Figure 3:
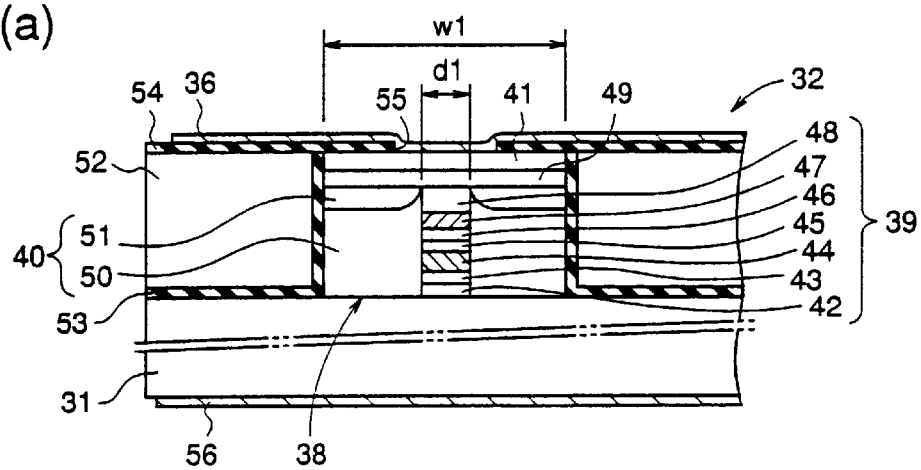
FIGS. 3(*a*)–3(*d*) are cross-sectional views of the semiconductor optical device that are taken along virtual planes 3*a*—3*a*, 3*b*—3*b*, 3*c*—3*c*, and 3*d*—3*d* shown in FIG. 1, respectively.
Figure 3:
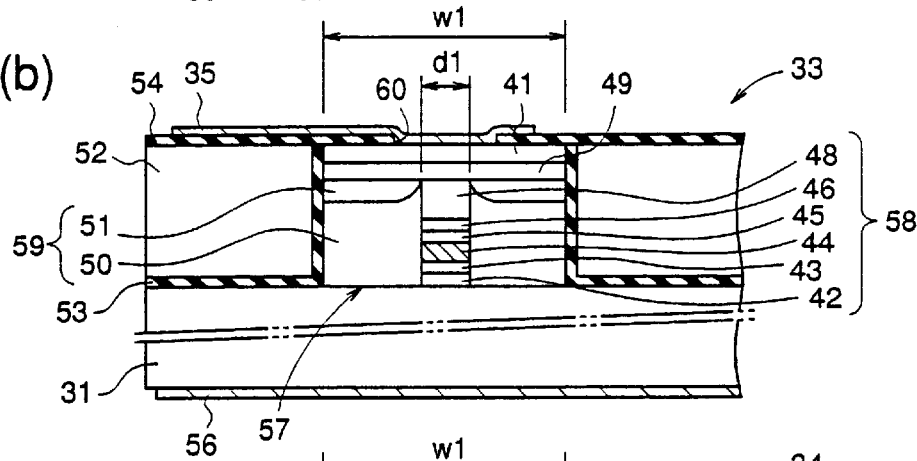
Figure 3:
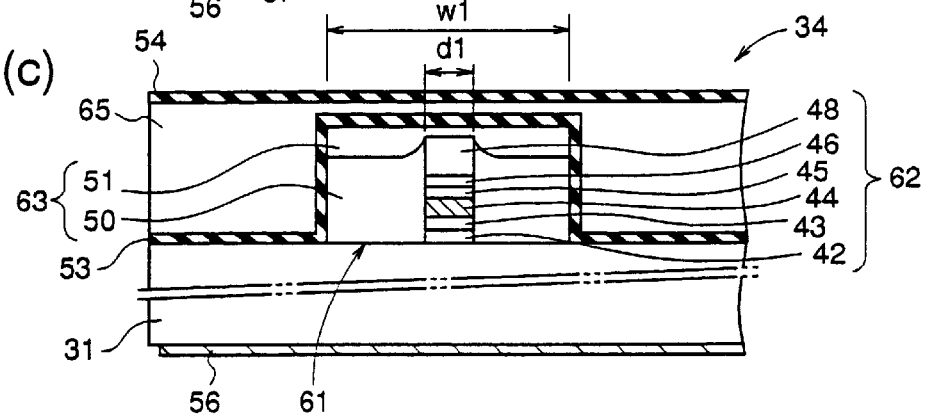
Figure 3:
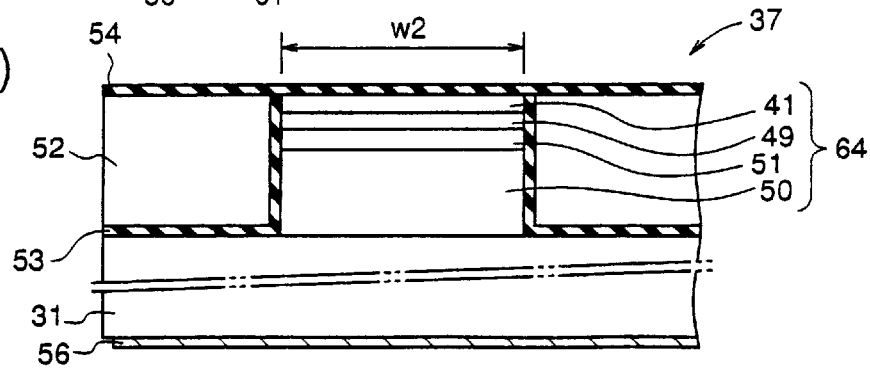

With reference to FIGS. 1 and 3(*d*), the mesa width W2 of the window structure 64 is larger than the mesa width W1 of the second optical waveguide mesa structure 57 of the light modulator 33. Therefore, even when laser light is radially propagated from the light modulator 33 to the window structure 64, the light is prevented from leaking out of the window structure 64. In other words, the laser light radially propagated is prevented from reaching the interface of the window structure 64 and the polyimide layer. Consequently, the laser light can be prevented from being reflected at the interface of the window structure 64 and the polyimide layer, thereby preventing irregular reflection of the laser light in the window structure 64.

Figure 25:
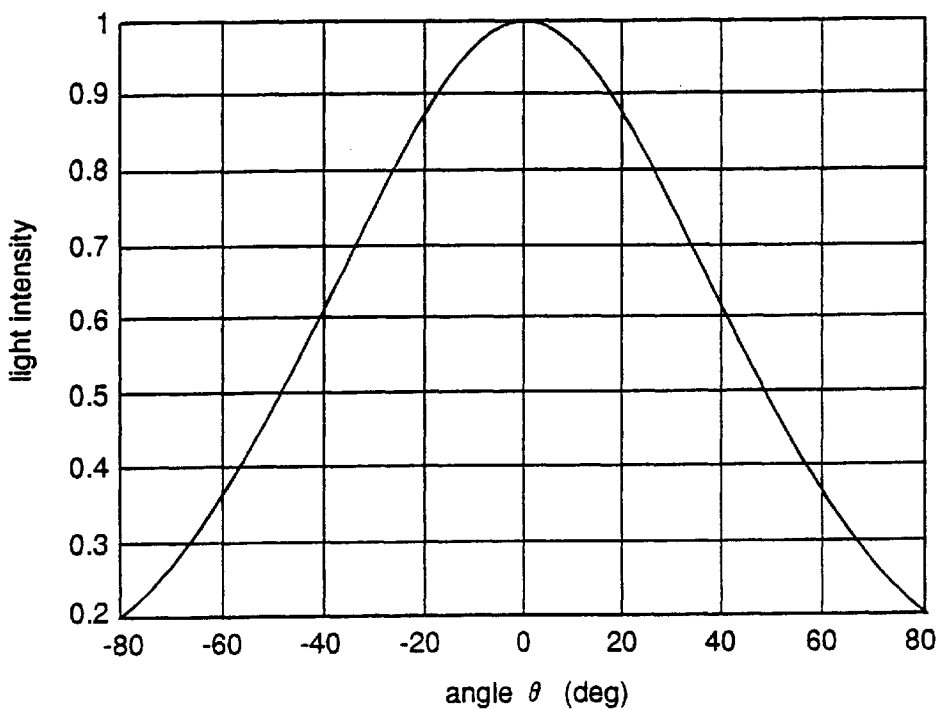
FIG. 25 is a graph showing a far field pattern of the semiconductor optical device.

FIG. 25 is a graph showing a far field pattern of the semiconductor optical device 30. As shown in the figure, the semiconductor optical device 30 exhibits an extremely good single mode. That is, the beam shape of laser light emitted from the window structure 64 is good. As a result, satisfactory connection to an optical system is possible when the semiconductor optical device 30 is used in optical communication.

Especially in the embodiment of the present invention, the mesa width of the window structure 64 gradually increase toward W2 corresponding to the radiant angle of the laser light radially propagated. Accordingly, the laser light radially propagated in the window structure 64 is prevented all the more from reaching the interface of the window structure 64 and the polyimide layer. Thus, the laser light can be reliably prevented from being reflected at the interface of the window structure 64 and the polyimide layer, resulting in no irregular reflection of the laser light in the window structure 64. Consequently, deterioration of the beam shape of laser light emitted from the window structure 64 can be reliably suppressed.

Further, since the laser light radially propagated is prevented from leaking out of the window structure 64 by gradually increasing the mesa width of the window structure 64 toward W2 corresponding to the radiant angle of the laser light, the size of the window structure 64 is reduced to the minimum. As a result, an increase in electric capacitance with an increase in size of the window structure 64 can be suppressed, whereby high-speed operation of the light modulator 33 is not adversely affected very much.

A description is given of a modification of the embodiment of the present invention.

Figure 26:
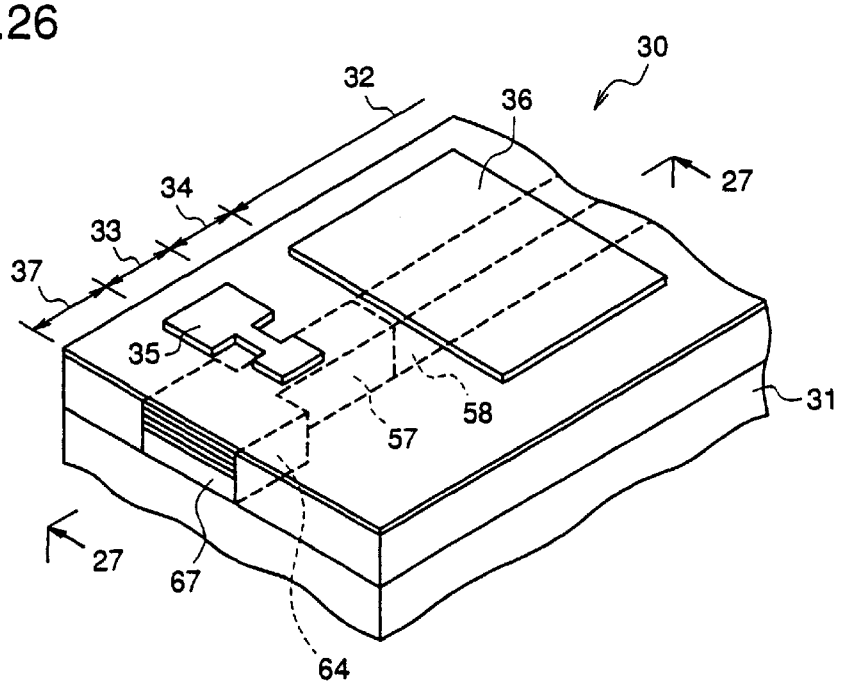
FIG. 26 is a schematic perspective view illustrating a principal part of a semiconductor optical device according to a modification.
Figure 27:
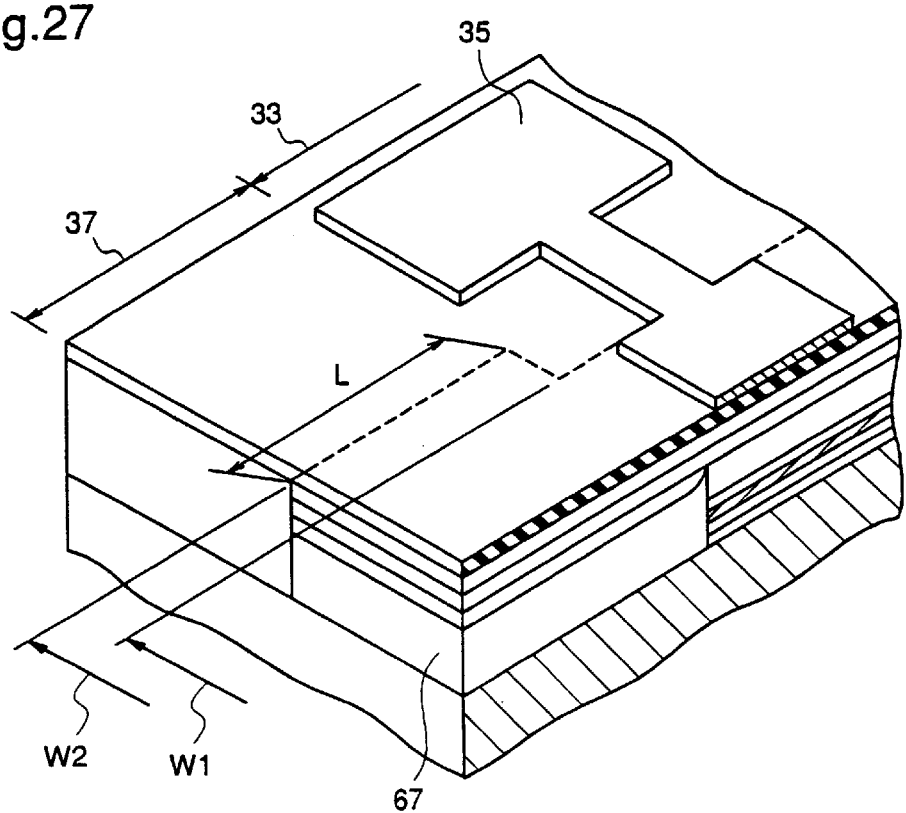
FIG. 27 is an enlarged schematic perspective view illustrating a part of the semiconductor optical device that is cut along a virtual plane 27—27 shown in FIG. 26.
Figure 28:
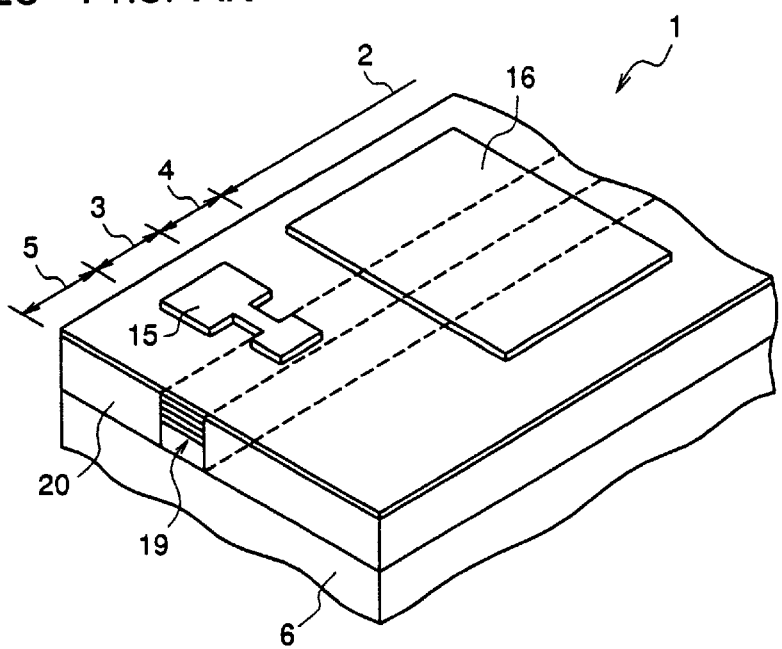
FIG. 28 is a schematic perspective view illustrating a principal part of a conventional semiconductor optical device.
Figure 29:
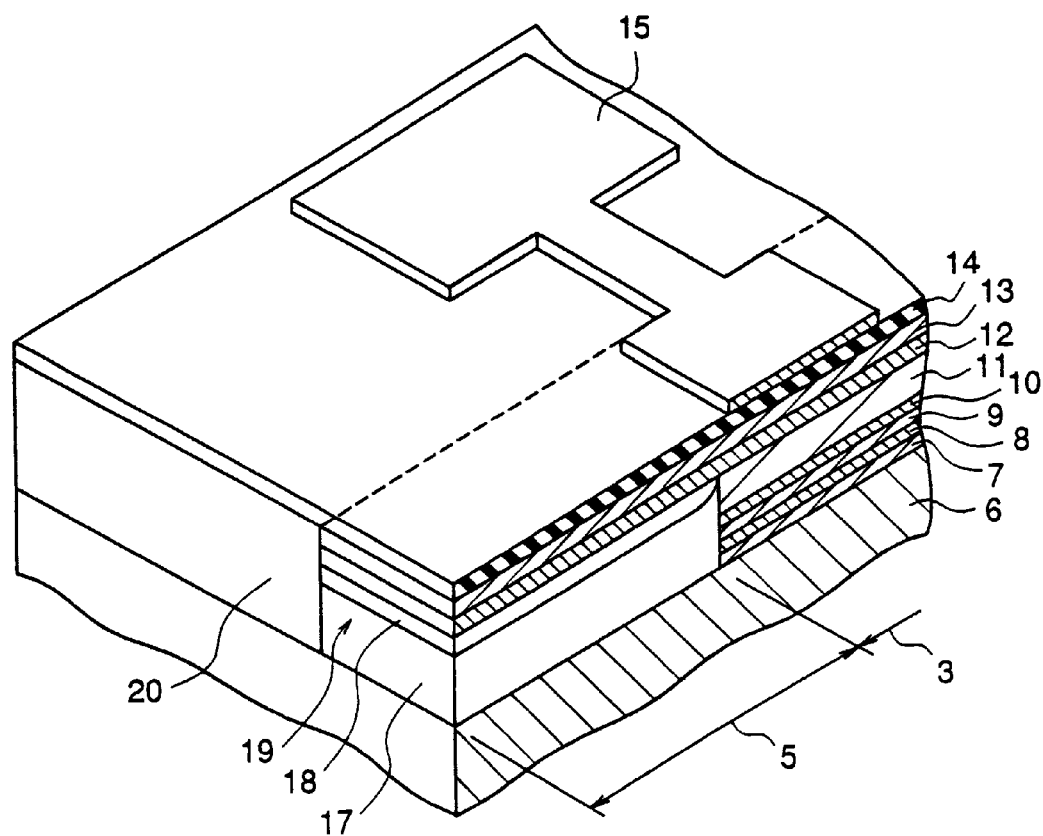
FIG. 29 is an enlarged schematic perspective view illustrating a structure of a light modulator region of the conventional semiconductor optical device.

FIG. 26 is a perspective view illustrating a principal part of a semiconductor optical device 30 according to the modification. FIG. 27 is an enlarged perspective view illustrating a part of the semiconductor optical device 30 that is cut along a virtual plane 27—27 shown in FIG. 26.

The semiconductor optical device 30 according to the embodiment of the invention has the funnel-shaped window structure 64, whereas the semiconductor optical device 30 according to the modification has a rectangular-shaped window structure 64. The other construction of the semiconductor optical device 30 according to the modification is identical to that of the semiconductor optical device 30 according to the embodiment of the invention. That is, the mesa width W2 of the window structure 64 is 20 μm, and the mesa width W1 of the second optical waveguide mesa structure 57 of the light modulator 33 is 10 μm. Therefore, a stage 90 is formed at the boundary between the window structure 64 and the second optical waveguide mesa structure 57.

Since the mesa width W2 of the window structure 64 is 20 μm, the semiconductor optical device 30 according to the modification has the same function and effect as in the embodiment of the invention. Especially in the semiconductor optical device 30 according to the modification, the rectangular window structure 64 is formed. Therefore, fabrication of the device is simpler than when the funnel-shaped window structure 64 is formed.

In addition, while in the embodiment of the invention and the modification a distributed feedback laser (DFB-LD) is used as an example, any laser having a diffraction grating, such as a distributed Bragg-reflector laser (DBR-LD), can be employed.

What is claimed is:

1. A semiconductor optical device including:

a semiconductor laser region for producing laser light and having a first optical waveguide mesa structure with a first mesa width, said first optical waveguide mesa structure including a first optical waveguide portion including a first active layer and a diffraction grating, and first current blocking layers adjacent to opposite sides of said first optical waveguide portion;

a light modulator region for modulating the laser light produced by said semiconductor laser region and having a second optical waveguide a mesa structure with a second mesa width, said second optical waveguide mesa structure being continuous with said first optical waveguide mesa structure and including a second optical waveguide portion comprising a second active layer, and second current blocking layers adjacent to opposite sides of said second optical waveguide portion;

a window region for propagating the laser light modulated by said light modulator region and having a mesa-shaped window structure with a third mesa width, said window structure being continuous with said second optical waveguide and interposed between a facet of said semiconductor device where light is emitted from said semiconductor device and said second optical waveguide mesa structure, said second active layer extending to but not into said window region; and a semiconductor substrate on which said semiconductor laser region, said light modulator region, and said window region are integrated, wherein the third mesa width of said window structure is larger than the second mesa width of said second optical waveguide mesa structure.

2. The semiconductor optical device of claim 1 wherein the third mesa width of said window structure gradually increases from the second mesa width at a junction of said light modulator region and said window region, in a direction of propagation of the laser light.

3. The semiconductor optical device of claim 1 wherein the third mesa width of said window structure abruptly increases from the second mesa width at a junction of said light modulator region and said window region, in a direction of propagation of the laser light.

4. The semiconductor optical device of claim 1 wherein the second mesa width of said second optical waveguide mesa structure is substantially equal to the first mesa width of said first optical waveguide mesa structure.

* * * * *